(12) United States Patent
Sung

(10) Patent No.: US 10,910,512 B2
(45) Date of Patent: Feb. 2, 2021

(54) NANO-SCALE LED ELEMENT FOR HORIZONTALLY-ALIGNED ASSEMBLY, METHOD FOR MANUFACTURING SAME, AND HORIZONTALLY-ALIGNED ASSEMBLY COMPRISING SAME MICRO-LED

(71) Applicant: SAMSUNG DISPLAY CO., LTD., Yongin-si (KR)

(72) Inventor: Yeon Goog Sung, Gyeonggi-do (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/528,046

(22) PCT Filed: Nov. 13, 2015

(86) PCT No.: PCT/KR2015/012252
§ 371 (c)(1),
(2) Date: May 18, 2017

(87) PCT Pub. No.: WO2016/080712
PCT Pub. Date: May 26, 2016

(65) Prior Publication Data
US 2017/0317228 A1 Nov. 2, 2017

(30) Foreign Application Priority Data
Nov. 18, 2014 (KR) .......................... 10-2014-0161067

(51) Int. Cl.
*H01L 33/00* (2010.01)
*H01L 33/20* (2010.01)
(Continued)

(52) U.S. Cl.
CPC .......... *H01L 33/0075* (2013.01); *H01L 33/06* (2013.01); *H01L 33/08* (2013.01);
(Continued)

(58) Field of Classification Search
CPC ................................. H01L 33/44; H01L 33/36
See application file for complete search history.

(56) References Cited

U.S. PATENT DOCUMENTS 7,825,328 B2 * 11/2010 Li .................... H01L 31/0687
136/249
8,129,710 B2 * 3/2012 Cho .................... H01L 33/18
257/10
(Continued)

FOREIGN PATENT DOCUMENTS

JP 2011-91257 A 5/2011
JP 2011-205106 A 10/2011
(Continued)

OTHER PUBLICATIONS

Translation for Korean Publication 1020120122159.*
(Continued)

*Primary Examiner* — Eugene Lee
(74) *Attorney, Agent, or Firm* — Lewis Roca Rothgerber Christie LLP

(57) ABSTRACT

The present invention relates to a nano-scale light-emitting diode (LED) element for a horizontal array assembly, a manufacturing method thereof, and a horizontal array assembly including the same, and more particularly, to a nano-scale LED element for a horizontal array assembly that can significantly increase the number of nano-scale LED elements connected to an electrode line, facilitate an arrangement of the elements, and implement a horizontal array assembly having a very good electric connection between an electrode and an element and a significant high quantity of light when a horizontal array assembly having the nano-scale LED elements laid in a length direction thereof and connected to the electrode line is manufactured, (Continued)

US 10,910,512 B2
Page 2 a manufacturing method thereof, and a horizontal array assembly including the same.

10 Claims, 10 Drawing Sheets

(51) Int. Cl.
*H01L 33/06* (2010.01)
*H01L 33/08* (2010.01)
*H01L 33/24* (2010.01)
*H01L 33/38* (2010.01)
*H01L 33/44* (2010.01)
*B82B 3/00* (2006.01)
*H01L 33/32* (2010.01)

(52) U.S. Cl.
CPC .............. *H01L 33/20* (2013.01); *H01L 33/24* (2013.01); *H01L 33/38* (2013.01); *H01L 33/44* (2013.01); *B82B 3/0052* (2013.01); *H01L 33/32* (2013.01); *H01L 33/385* (2013.01); *H01L 2224/95085* (2013.01); *H01L 2933/0016* (2013.01); *H01L 2933/0025* (2013.01)

(56) References Cited

U.S. PATENT DOCUMENTS

| | | | |
|---|---|---|---|
| 8,330,173 B2 * | 12/2012 | Kim ................ | H01L 33/06 257/13 |
| 8,378,349 B2 * | 2/2013 | Ko ................ | H01L 27/3211 257/369 |
| 8,871,544 B2 | 10/2014 | Jeong et al. | |
| 9,112,112 B2 | 8/2015 | Do et al. | |
| 9,570,425 B2 * | 2/2017 | Do ................ | H01L 25/0753 |
| 9,773,761 B2 * | 9/2017 | Do ................ | H01L 25/0753 |
| 9,978,725 B2 * | 5/2018 | Do ................ | H01L 25/0753 |
| 10,276,630 B2 * | 4/2019 | Lee ................ | H01L 25/0753 |
| 2003/0141507 A1 * | 7/2003 | Krames ................ | H01L 33/08 257/79 |
| 2006/0023451 A1 | 2/2006 | Han et al. | |
| 2007/0042520 A1 | 2/2007 | Oh et al. | |
| 2009/0137075 A1 | 5/2009 | Yang et al. | |
| 2009/0267049 A1 | 10/2009 | Cho et al. | |
| 2009/0303713 A1 | 12/2009 | Chang et al. | |
| 2011/0033976 A1 | 2/2011 | Di Cioccio et al. | |
| 2011/0254043 A1 * | 10/2011 | Negishi ................ | H01L 33/20 257/99 |
| 2011/0272014 A1 * | 11/2011 | Mathai ............ | H01L 31/035281 136/255 |
| 2011/0309382 A1 * | 12/2011 | Lowgren ................ | B82Y 20/00 257/88 |
| 2012/0181546 A1 | 7/2012 | Tu | |
| 2012/0248408 A1 | 10/2012 | Paek et al. | |
| 2013/0027623 A1 | 1/2013 | Negishi et al. | |
| 2013/0221385 A1 | 8/2013 | Shibata et al. | |
| 2014/0034120 A1 * | 2/2014 | Wang ................ | H01L 21/02521 136/255 |
| 2014/0124801 A1 | 5/2014 | Lee | |
| 2014/0209858 A1 * | 7/2014 | Cha ........................ | H01L 33/08 257/13 |
| 2014/0209942 A1 | 7/2014 | Dingemans et al. | |
| 2015/0062484 A1 | 3/2015 | Lee et al. | |
| 2017/0062684 A1 | 3/2017 | Ikeda et al. | |
| 2017/0317228 A1 | 11/2017 | Sung | |
| 2018/0287010 A1 | 10/2018 | Sung | |

FOREIGN PATENT DOCUMENTS

| | | |
|---|---|---|
| JP | 2015-76585 A | 4/2015 |
| KR | 10-2008-0021023 A | 3/2008 |
| KR | 20090020869 | 2/2009 |
| KR | 10-0903280 B1 | 6/2009 |
| KR | 20090121743 | 11/2009 |
| KR | 10-2010-0066768 A | 6/2010 |
| KR | 10-2010-0091269 A | 8/2010 |
| KR | 10-2012-0022649 A | 3/2012 |
| KR | 10-2012-0120377 A | 11/2012 |
| KR | 20120122159 | 11/2012 |
| KR | 10-1209449 B1 | 12/2012 |
| KR | 101429095 | 8/2014 |
| KR | 101436123 | 11/2014 |
| KR | 10-2015-0006798 A | 1/2015 |
| WO | WO2016/080710 | 5/2016 |

OTHER PUBLICATIONS

International Search Report for PCT/KR2014/006122, dated Aug. 25, 2014, 2 pages.
Office Action issued in U.S. Appl. No. 15/528,035 by the USPTO, dated Sep. 10, 2018, 11 pages.
Final Office Action issued in U.S. Appl. No. 15/528,035 by the USPTO, dated Mar. 15, 2019, 25 pages.
Office Action issued in U.S. Appl. No. 16/070,184 by the USPTO, dated Aug. 29, 2019, 9 pages.
Office Action issued in U.S. Appl. No. 15/528,035 by the USPTO, dated Sep. 5, 2019, 15 pages.
Final Office Action issued in U.S. Appl. No. 15/528,035 by the USPTO, dated Mar. 13, 2020, 17 pages.
Office Action issued in U.S. Appl. No. 16/070,184 by the USPTO, dated May 12, 2020, 8 pages.

* cited by examiner (a)　　　　　　(b)

(a)    (b)

<A-A Cross-Section>

NANO-SCALE LED ELEMENT FOR HORIZONTALLY-ALIGNED ASSEMBLY, METHOD FOR MANUFACTURING SAME, AND HORIZONTALLY-ALIGNED ASSEMBLY COMPRISING SAME MICRO-LED

TECHNICAL FIELD

Cross-Reference to Related Applications

This application is a national phase application under 35 U.S.C. § 371 of International Application No. PCT/KR2015/012252, filed Nov. 13, 2015, which claims priority to Korean Patent Application No. 10-2014-0161067, filed Nov. 18, 2014, the contents of which applications are incorporated into the present application by reference.

The present invention relates to a nano-scale light-emitting diode (LED) element for a horizontal array assembly, a method of manufacturing the same, and a horizontal array assembly including the same, and more particularly, to a nano-scale LED element for a horizontal array assembly that can significantly increase the number of nano-scale LED elements connected to an electrode line, facilitate an arrangement of elements thereof, and implement a horizontal array assembly having a very good electric connection between an electrode and an element and a significantly high quantity of light when a horizontal array assembly having the nano-scale LED elements laid in a length direction thereof and connected to the electrode line is manufactured, a manufacturing method thereof, and a horizontal array assembly including the same.

BACKGROUND ART

Light-emitting diodes (LEDs) have been actively developed since 1992 when Shuji Nakamura et al. of Nichia Corporation of Japan succeeded in fusing high-quality monocrystalline GaN nitride semiconductors by applying a low-temperature GaN compound buffer layer. LEDs have a semiconductor structure formed by bonding an n-type semiconductor crystal in which electrons are majority carriers and a p-type semiconductor crystal in which holes are majority carriers, and a semiconductor device that converts electronic signals into light having a desired wavelength band and emits the light. In relation to such LEDs, Korean Patent Publication No. 2009-0020869 discloses a method of fabricating an LED and an LED fabricated by the same.

Such an LED semiconductor is a green material, which is called a revolution of light, because of a high light conversion efficiency thereof, very low energy consumption, a semi-permanent lifetime, and environmental friendliness. Recently, red, orange, green, blue, and white LEDs having high brightness have been developed along with the development of compound semiconductor technology, and the LEDs are applicable to many fields, such as traffic lights, mobile phones, automobile headlights, outdoor display boards, LCD backlight units, and indoor or outdoor lights, and have been actively developed at home and abroad. In particular, since a GaN compound semiconductor having a wide band gap is used to manufacture an LED semiconductor that emits green, blue, and ultraviolet light and a blue LED element can be used to manufacture a white LED element, many studies have been done on such a GaN compound semiconductor.

Among these series of studies, research has been actively conducted on nano-scale LED elements produced in nano or micro units in order to apply such nano-scale LED elements to lights, displays, or the like. In this research, attention has been focused on electrodes for applying power to nano-scale LED elements, electrode arrangements based on utilization objectives and for reducing space occupied by electrodes, methods of mounting nano-scale LED elements on electrodes, and the like.

In particular, methods of mounting nano-scale LED elements on electrodes still have difficulties in that it is very difficult to place and mount nano-scale LED elements on electrodes as intended because of a limitation of a size of each of the nano-scale LED elements. This is because nano-scale LED elements are nano- or micro-scale devices and cannot be individually arranged and mounted in a target electrode region with human hands.

In addition, it is very difficult to control the number of nano-scale LED elements included in a unit electrode region, a positional relationship between an electrode and the nano-scale LED elements, etc. when the nano-scale LED elements are mounted in a target electrode region, and it is also difficult to obtain a high quantity of light due to a limitation in the number of LED elements included in a unit area when the LED elements are arranged in a two-dimensional plane. Furthermore, it is further difficult to obtain a desired quantity of light because not all nano-scale LED elements connected to two different electrodes can emit light without a defect such as an electrical short.

Accordingly, realizing a nano-scale LED element that can be easily laid in a length direction and mounted on a target electrode region is critically required. According, it is possible to improve an alignment of the mounted element to increase the number of LED elements included per unit area of an electrode line and also to significantly improve electrical connectivity of an electrode and the LED elements.

SUMMARY OF THE INVENTION

The present invention is designed to solve the above problems.

A first objective of the present invention is to provide a nano-scale light-emitting diode (LED) element for a horizontal array assembly that can be easily laid in a length direction and mounted on a desired electrode region, and a manufacturing method thereof. According to the present invention, it is possible to improve an alignment of LED elements mounted on a desired electrode region to significantly increase the number of LED elements that are included per unit area of an electrode line and significantly improve electrical connectivity between the electrode and the LED elements.

A second objective of the present invention is to provide a horizontal array assembly that can significantly increase the number of nano-scale LED elements that are mounted per unit area of an electrode line by utilizing the nano-scale LED element according to the present invention, and that can have a good electrical connectivity between an electrode and the nano-scale LED elements to emit light without faults and achieve a desired quantity of light when power is applied to the electrode.

In order to accomplish the first objective, the present invention provides a nano-scale light-emitting diode (LED) element for a horizontal array assembly including a first conductive semiconductor layer, an active layer formed above the first conductive semiconductor layer, and a second conductive semiconductor layer formed above the active layer, the nano-scale LED element including an insulating film configured to cover at least an outer surface of the active layer among outer surfaces of the first conductive semiconductor layer, the active layer, and the second conductive semiconductor layer; and a metal cap formed at at least one end part of the nano-scale LED element, wherein the metal cap extends from the one end part of the element and covers a side surface of the element, and an outer surface of the metal cap is at least partially curved.

According to a preferred embodiment of the present invention, any one of the first conductive semiconductor layer and the second conductive semiconductor layer may include at least one n-type semiconductor layer, and the other one may include at least one p-type semiconductor layer.

According to another preferred embodiment of the present invention, the nano-scale LED element may have a swab-shaped or dumbbell-shaped cross-section in a direction perpendicular to the semiconductor layers.

According to still another preferred embodiment of the present invention, a ratio of a surface area of the metal cap to a sectional area of the one end part of the nano-scale LED element may range from 1:1.1 to 1:10.0.

According to another preferred embodiment of the present invention, the nano-scale LED element may have a length of 100 nm to 10 μm, and the nano-scale LED element, including the first conductive semiconductor layer, the active layer, and the second conductive semiconductor layer, has a diameter of 100 nm to 5 μm.

According to still another embodiment of the present invention, the metal cap may partially cover an outer surface of an insulating film formed on an outer surface of the nano-scale LED element.

In order to accomplish the first objective, the present invention also provides a method of manufacturing a nano-scale LED element for a horizontal array assembly, the method including steps of: (1) etching a laminate having a first conductive semiconductor layer, an active layer, and a second conductive semiconductor layer sequentially stacked on a substrate so that the element has a nano- or micro-scale diameter; (2) forming an insulating film on an outer surface of the etched laminate including the first conductive semiconductor layer, the active layer, and the second conductive semiconductor layer; and (3) removing the insulating film to expose a part of an outer surface including a top surface of the second conductive semiconductor layer, forming a metal cap on the exposed outer surface of the second conductive semiconductor layer, and then removing the substrate.

According to a preferred embodiment of the present invention, step (1) may include steps of: 1-1) manufacturing the laminate by sequentially stacking the first conductive semiconductor layer, the active layer, and the second conductive semiconductor layer on the substrate; 1-2) forming an insulating layer and a metal mask layer on the second conductive semiconductor layer; 1-3) forming a polymer layer on the metal mask layer and forming a pattern on the polymer layer on a nano- or micro-scale; and 1-4) etching the first conductive semiconductor layer, the active layer, and the second conductive semiconductor layer on a nano- or micro-scale according to the pattern.

According to another preferred embodiment of the present invention, step (1) may include steps of: 1-1) sequentially stacking the first conductive semiconductor layer, the active layer, and the second conductive semiconductor layer on the substrate; 1-2) forming an insulating layer and a metal mask layer on the second conductive semiconductor layer; 1-3) forming a nano-sphere or micro-sphere monolayer film on the metal mask layer and performing self-assembly; and 1-4) etching the first conductive semiconductor layer, the active layer, and the second conductive semiconductor layer on a nano- or micro-scale according to a pattern.

According to another preferred embodiment of the present invention, step (3) may include steps of: 3-1) removing the insulating film to expose a partial outer surface including a top surface of the second conductive semiconductor layer; 3-2) immersing the etched laminate in an electrolytic plating solution and applying power to the laminate to form a metal cap on the exposed outer surface of the second conductive semiconductor layer through plating; and 3-3) removing the substrate from the laminate.

According to still another preferred embodiment of the present invention, step (3) may include steps of: 3-1) removing the insulating film to expose the part of the outer surface including the top surface of the second conductive semiconductor layer; 3-2) immersing the etched laminate in an electrolytic plating solution and applying power to the laminate to form the metal cap on the exposed outer surface of the second conductive semiconductor layer through plating; 3-3) forming a support film above the metal cap and removing the substrate from the laminate; and 3-4) immersing the laminate from which the substrate has been removed in an electrolytic plating solution and applying power to the laminate to form the metal cap on an exposed part of the outer surface including a bottom surface of the first conductive semiconductor layer through plating and then removing the support film.

According to a preferred embodiment of the present invention, any one of the first conductive semiconductor layer and the second conductive semiconductor layer may include at least one n-type semiconductor layer, and the other one may include at least one p-type semiconductor layer.

In order to accomplish the second objective, the present invention provides a horizontal array assembly including a base substrate; an electrode line including a first electrode formed on the base substrate and a second electrode formed apart from the first electrode on the base substrate; and a plurality of nano-scale LED elements according connected to both the first electrode and the second electrode.

According to a preferred embodiment of the present invention, the horizontal array assembly may include one or more first nano-scale LED elements connected to a top surface of one of the first electrode and the second electrode at one side thereof and connected to a top surface of the other electrode at the other side thereof; a second nano-scale LED element connected to a side surface of the first electrode at one side thereof and connected to a side surface of the second electrode facing the side surface of the first electrode at the other side thereof; and a third nano-scale LED element connected to the top surface of one of the first electrode and the second electrode at one side thereof and connected to the side surface of the other electrode at the other side thereof.

According to another preferred embodiment of the present invention, the plurality of nano-scale LED elements may be connected to one side surface of the first electrode at one sides thereof and connected to one side surface of the second electrode facing the one side of the first electrode at the other sides thereof and are disposed between the two different electrodes to form a multilayer.

Terms used in the present invention will be defined in the following description.

In descriptions of embodiments of the present invention, it should be understood that when a layer, region, pattern or structure is referred to as being "on," "above," or "under" a substrate, another layer, another region, or another pattern, the terminology of "on," "above," or "under" includes both the meanings of "directly" and "indirectly" "on," "above," or "under."

In descriptions of embodiments of the present invention, a "first electrode" and a "second electrode" include even electrode regions in which nano-scale LEDs may be substantially mounted or electrode regions that may be further included according to a method of placing the electrodes on a base substrate.

In descriptions of embodiments of the present invention, a "connection" refers to a nano-scale LED element being in contact with a first electrode at one side and a second electrode at the other side. Also, an "electrical connection" refers to a nano-scale LED element being capable of emitting light when power is applied to an electrode line while the nano-scale LED is inserted and connected between two different electrodes.

In descriptions of embodiments of the present invention, "same," "horizontal," or "vertical" is not limited to physically accurate "same," "horizontal," or "vertical," and includes meanings that are substantially considered to be "same," "horizontal," or "vertical."

In descriptions of embodiments of the present invention, an "end part" of an element includes an end of the element in a length direction of the element and a portion of an outer surface of the element that extends from the end.

In descriptions of embodiments of the present invention, a "horizontal array assembly" refers to an assembly implemented such that a nano-scale LED element is horizontally laid on a base substrate in a length direction of the element and connected to two different electrodes formed on the base substrate. An example thereof is the same as shown in FIG. 1, and the element length direction refers to a direction perpendicular to each layer included in the nano-scale LED element.

The present invention can implement a nano-scale light-emitting diode (LED) element that can be easily laid in a length direction and mounted on a desired electrode region to improve an alignment of the mounted element. As a result, it is possible to significantly increase the number of LED elements that are included per unit area of an electrode line and significantly improve electrical connectivity between the electrode and the LED elements. The present invention can also implement a horizontal array assembly that can significantly increase the number of nano-scale LED elements that are mounted per unit area of an electrode line, achieve a desired quantity of light by emitting light without faults when power is applied thereto due to good electrical connectivity between the electrode and the mounted nano-scale LED elements, increase a usage lifetime thereof due to an increase in durability of the LED elements along and a decrease in heat generation, and increase luminous efficiency due to an increase in the number of elements. Accordingly, the present invention is applicable to various fields such as lights, displays, etc.

DETAILED DESCRIPTION OF THE INVENTION

Hereinafter, preferred embodiments of the present invention will be described in detail with reference to the accompanying drawings.

As described above, since nano-scale light-emitting diode (LED) elements cannot be individually arranged and mounted in a target electrode region with human hands because of a limitation of a size of each of the nano-scale LED elements, it is very difficult to arrange and mount the nano-scale LED elements on the electrode as intended. In order to solve such a problem, the inventor of the present invention found that a nano-scale LED horizontal array assembly may be implemented in which nano-scale LED elements are self-aligned due to an influence of an electric field so that both ends of each of the elements are connected to two different electrodes when power is applied to an electrode line into which a solution containing the nano-scale LED elements is injected. However, the present inventor recognized that since the self-alignment of the nano-scale LED elements may be unsatisfactory due to an electric field formed at an electrode line to which the power is applied, the LED elements having the unsatisfactory self-alignment may be badly arranged on an electrode line, and the number of nano-scale LEDs that are connected to the electrode cannot be increased due to the bad arrangement. That is, there are still problems in that it is very difficult to control the number of nano-scale LED elements included in a unit electrode region, a positional relationship between an electrode and the nano-scale LED elements, and the like when the nano-scale LED elements are mounted in the target electrode region, and it is also impossible to obtain a high quantity of light due to a significant decrease in the number of LED elements that can be included in the unit area when the LED elements are poorly arranged in a two-dimensional plane.

Figure 1:
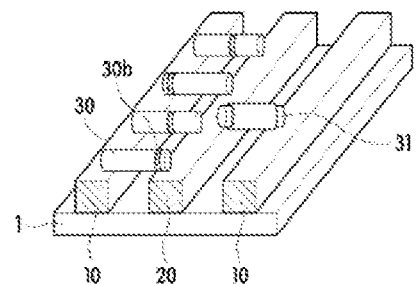
FIG. 1 is a partial perspective view of a horizontal array assembly using a conventional nano-scale light-emitting diode (LED) element.

In detail, FIG. 1 is a partial perspective view of a horizontal array assembly using a conventional nano-scale LED element and shows a first electrode 10 formed on a base substrate 1, a second electrode 20 formed apart from the first electrode 10 on the base substrate 1, and a nano-scale LED element 30 connected to the first electrode 10 and the second electrode 20. The nano-scale LED element 30 is connected to the two electrodes 10 and 20 that are different from each other, but the first electrode 10 is connected just up to an active layer 30b of the nano-scale LED element 30. Accordingly, the nano-scale LED element 30 cannot emit light due to an electrical short occurring when power is applied to the first electrode 10 and the second electrode 20.

Figure 2:
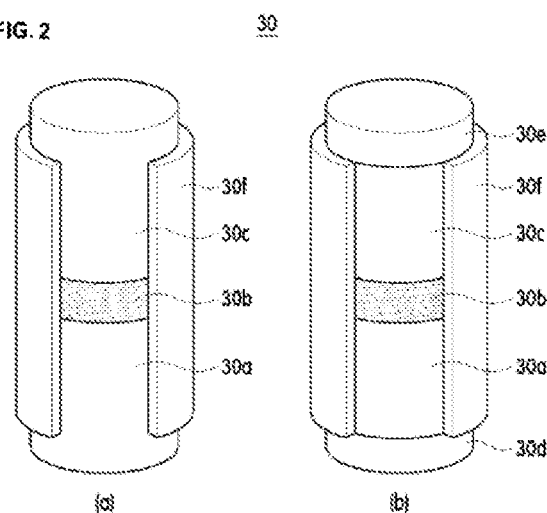
FIG. 2 is an exploded perspective view of a nano-scale LED element including an insulating film.

In order to solve such a problem, the present inventor attempted to use a nano-scale LED element 31 having an outer surface coated with an insulating film (see FIG. 1) to implement a horizontal array assembly in which nano-scale LED elements are horizontally arranged on an electrode without faults. In detail, FIG. 2 is an exploded perspective view of a nano-scale LED element 30 including an insulating film. A nano-scale LED element of FIG. 2A includes an active layer 30b formed above a first conductive semiconductor layer 30a, a second conductive semiconductor layer 30c formed above the active layer 30b, and an insulating film 30f formed to entirely cover an outer surface of the active layer 30b and partially cover the first conductive semiconductor layer 30a and the second conductive semiconductor layer 30c. Also, a nano-scale LED element of FIG. 2B includes an active layer 30b formed above a first conductive semiconductor layer 30a, a second conductive semiconductor layer 30c formed above the active layer 30b, a first electrode layer 30d and a second electrode layer 30e formed below the first conductive semiconductor layer 30a and above the second conductive semiconductor layer 30c, respectively, and an insulating film 30f formed to cover the first conductive semiconductor layer 30a, the active layer 30b, and the second conductive semiconductor layer 30c. As shown in FIG. 2A or 2B, when a nano-scale LED element having an outer surface coated with an insulating film is used, it is possible to prevent defects such as electrical shorts that occur when an active layer of the element comes into contact with an electrode, but it is still impossible to increase the number of nano-scale LED elements that are included per unit area of the electrode because the arrangement of the nano-scale LED elements on the electrode is worsened due to the insulating film, and it is also still difficult to obtain a desired quantity of light because the nano-scale LED element is often not electrically connected to the electrode although the nano-scale LED element is connected to the electrode.

Figure 3:
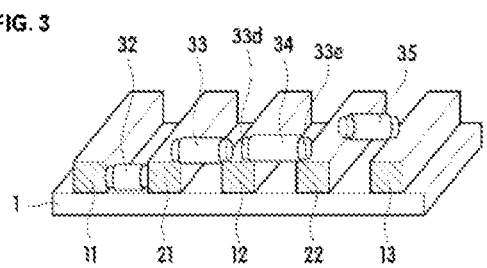
FIG. 3 is a partial perspective view of a horizontal array assembly including a nano-scale LED element including an insulating film.

In detail, FIG. 3 is a partial perspective view of a horizontal array assembly including a nano-scale LED element including an insulating film and shows first electrodes 11, 12, and 13 formed on a base substrate 1, second electrodes 21 and 22 formed apart from the first electrodes 11, 12, and 13 on the base substrate 1, and nano-scale LED elements 32, 33, 34, and 35 connected to the first electrodes 11, 12, and 13 and the second electrodes 21 and 22. It can be seen that, among the nano-scale LED elements of FIG. 3, the LED element A 32, the LED element B 33, and the LED element D 35 each have electrode layers or conductive semiconductor layers in contact with the electrodes at both end parts thereof and are electrically connected to the electrodes while the LED element C 34 has only one side 32d in contact with the electrode and the other side 33e not in contact with the electrode and is not electrically connected to the electrode. That is, only when coordination of conditions on a distance between two different electrodes, a length of a nano-scale LED element, and a thickness of both end parts that are not coated with the insulating film on an outer surface of the element is accomplished, a horizontal array assembly that achieves electrical connection may be implemented. However, the conditions require fine control in nano or micro units, and thus it is very difficult to actually implement a target horizontal array assembly.

Figure 4:
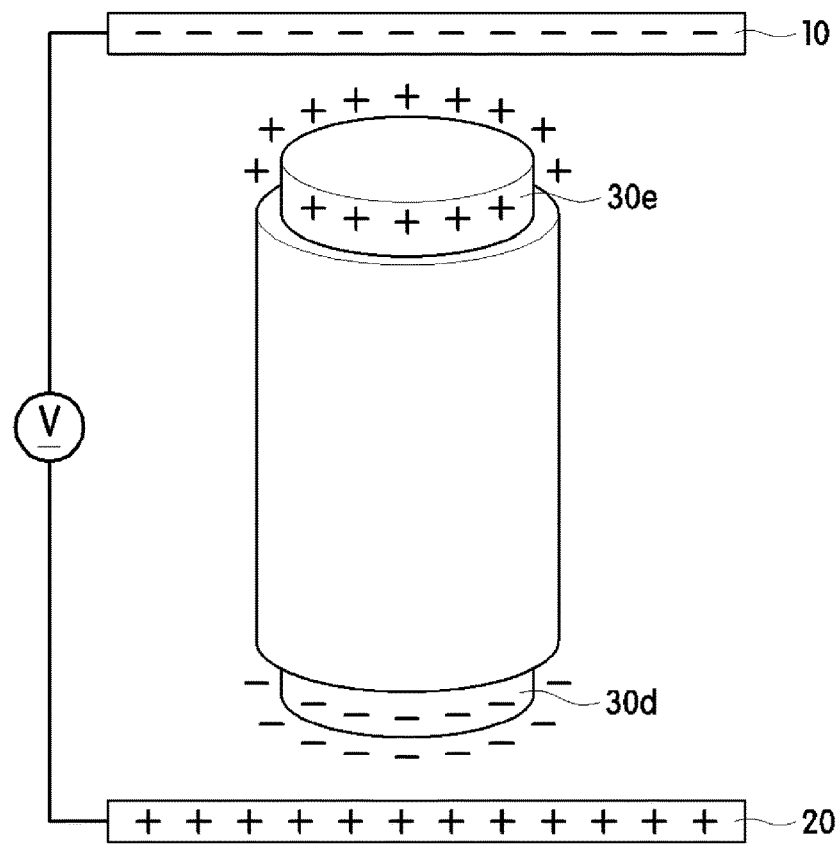
FIG. 4 is a perspective view of a nano-scale LED element placed between two electrodes between which an electric field is formed.

Also, a nano-scale LED element is simultaneously self-aligned by an electric field between two different electrodes and connected to the two electrodes. The nano-scale LED element shown in FIG. 2 may not be sufficiently and appropriately self-aligned because a region to be electrically charged (i.e., an exposed part not coated with the insulating film) has an extremely small surface area due to the insulating film. In detail, FIG. 4 is a perspective view of a nano-scale LED element placed between two electrodes between which an electric field is formed. A first electrode layer 30d and a second electrode layer 30e of the nano-scale LED element are negatively and positively charged by an electric field formed by a first electrode 10 and a second electrode 20, respectively. The first electrode layer 30d and the second electrode layer 30e are self-aligned toward the second electrode 20 and the first electrode 10, respectively. Accordingly, the nano-scale LED element may be connected to the first electrode 10 and the second electrode 20. However, since a surface area of an exposed part of the nano-scale LED element that is not coated with an insulating film is limited, the self-alignment of the nano-scale LED element by the electric field is extremely insufficient. Accordingly, it is impossible to align and connect the nano-scale LED element to an electrode as desired. Also, a thickness of the electrode layer (or a conductive semiconductor layer) and a diameter of the element should be decreased in order to increase a surface area of a region to be electrically charged by the electric field. This decreases the number of nano-scale LED elements that may be included in a unit electrode area.

Furthermore, even when nano-scale LED elements are connected to the electrode, multiple nano-scale LED elements having an insufficient electrical connection with the electrode may be included therein. In this case, it is possible to significantly reduce durability of the elements due to defects generated when the nano-scale LED elements do not emit light and heat generated by high resistance of connected parts between the electrode and the nano-scale LED elements.

Accordingly, the present invention is intended to solve the above-described problems by providing a nano-scale LED element for a horizontal array assembly including a first conductive semiconductor layer, an active layer formed above the first conductive semiconductor layer, and a second conductive semiconductor layer formed above the active layer. In this case, the nano-scale LED element includes a metal cap formed to cover an end part of the element and a portion of a side part of the element that extends from the end part, an outer surface of the metal cap is at least partially curved, and the metal cap is formed at one or more end parts of the nano-scale LED element. Accordingly, the nano-scale LED elements can be easily laid in a length direction and mounted on a desired electrode region, thus improving alignment of the mounted elements. As a result, it is possible to significantly increase the number of LED elements that are included per unit area of an electrode line and significantly improve electrical connectivity between the electrode and the LED elements.

In the following descriptions of the nano-scale LED element, "above" and "below" refer to a vertical upward direction and a vertical downward direction with respect to each layer included in the nano-scale LED element.

Figure 5:
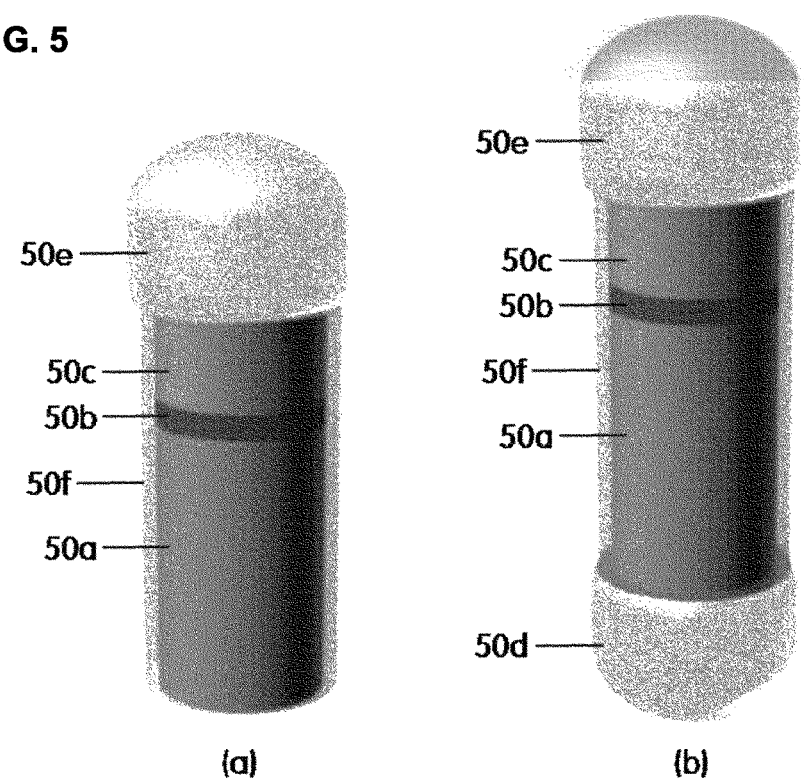
FIG. 5 is a perspective view of a nano-scale LED element according to a preferred embodiment of the present invention.

In detail, FIG. 5 is a perspective view of a nano-scale LED element according to a preferred embodiment of the present invention. FIG. 5A shows an active layer 50b being formed above a first conductive semiconductor layer 50a, a second conductive semiconductor layer 50c being formed above the active layer 50b, an insulating film 50f being formed to cover the active layer 50b and outer surfaces of the conductive semiconductor layers 50a and 50c, and a metal cap 50e being formed at one end part of the element toward the second conductive semiconductor layer 50c. Also, FIG. 5B shows the active layer 50b being formed above the first conductive semiconductor layer 50a, the second conductive semiconductor layer 50c being formed above the active layer 50b, the insulating film 50f being formed to cover the active layer 50b and the outer surfaces of the conductive semiconductor layers 50a and 50c, and metal caps 50d and 50e formed at both end parts of the element.

First, the conductive semiconductor layers 50a and 50c of the nano-scale LED element according to an embodiment of the present invention will be described.

Conductive semiconductor layers included in typical LED elements used in lights, displays, etc. may be used without limitation as the conductive semiconductor layers 50a and 50c. According to a preferred embodiment of the present invention, any one of the first conductive semiconductor layer and the second conductive semiconductor layer may include at least one n-type semiconductor layer, and the other one may include at least one p-type semiconductor layer.

When the first conductive semiconductor layer 50a includes an n-type semiconductor layer, the n-type semiconductor layer is made of one or more semiconductor materials selected from among semiconductors represented by the formula $In_xAl_yGa_{1-x-y}N$ ($0 \leq x \leq 1$, $0 \leq y \leq 1$, $0 \leq x+y \leq 1$), for example, InAlGaN, GaN, AlGaN, InGaN, AlN, and InN, which may be doped with a first conductive dopant (e.g., Si, Ge, Sn, etc.). According to a preferred embodiment of the present invention, the first conductive semiconductor layer 50a may have a thickness of 1.5 to 5 μm, but is not limited thereto.

When the second conductive semiconductor layer 50c includes a p-type semiconductor layer, the p-type semiconductor layer is made of one or more semiconductor materials selected from among semiconductors represented by the formula $In_xAl_yGa_{1-x-y}N$ ($0 \leq x \leq 1$, $0 \leq y \leq 1$, $0 \leq x+y \leq 1$), for example, InAlGaN, GaN, AlGaN, InGaN, AlN, and InN, which may be doped with a second conductive dopant (e.g., Mg). According to a preferred embodiment of the present invention, the second conductive semiconductor layer 50c may have a thickness of 0.08 to 0.25 μm, but is not limited thereto.

Next, the active layer 50b is formed above the first conductive semiconductor layer 50a and below the second conductive semiconductor layer 50c and may be formed in a single quantum well structure or multiple quantum well structures. Active layers included in typical LED elements used in lights, displays, etc. may be used without limitation as the active layer 50b. A cladding layer (not shown) doped with a conductive dopant may be formed above and/or below the active layer 50b, and the cladding layer doped with a conductive dopant may be implemented as an AlGaN layer or an InAlGaN layer. In addition, it should be appreciated that materials such as AlGaN and AlInGaN may be used as the active layer 50b. When an electric field is applied to the active layer 50b, light is created by electron-hole pair combination. According to a preferred embodiment of the present invention, the active layer 50b may have a thickness of 0.05 to 0.25 μm, but is not limited thereto.

The above-described first conductive semiconductor layer 50a, active layer 50b, and second conductive semiconductor layer 50c may be included as essential elements of a light emitting structure. Other phosphor layers, active layers, semiconductor layer, and/or electrode layers may be further included above/below each of the layers.

Next, the insulating film 50f is formed to cover at least an outer surface of the active layer 50b among outer surfaces of the first conductive semiconductor layer 50a, the active layer 50b, and the second conductive semiconductor layer 50c. Even when power is directly applied to the outer surface of the active layer 50b (e.g., when the active layer is brought into contact with the electrode), the active layer 50b is protected due to the insulating film 50f. Accordingly, it is possible to prevent the nano-scale LED element from being electrically short-circuited. Also, it is possible to prevent damage to an outer surface of semiconductor which may occur due to a collision between nano-scale LED elements when the nano-scale LED elements are self-aligned by an electric field between two different electrodes, thus preventing deterioration in durability of the nano-scale LED elements. Furthermore, the insulating film 50f is responsible for preventing a metal cap, which will be described below, from being formed over the entire outer surface of the element including the conductive semiconductor layer and the active layer and helping the metal cap to be formed at one end part or both end parts of the element in various shapes and wide surface areas.

The insulating film 50f may preferably include one or more of silicon nitride ($Si_3N_4$), silicon dioxide ($SiO_2$), aluminum oxide ($Al_2O_3$), hafnium oxide ($HfO_2$), yttrium oxide ($Y_2O_3$), and titanium oxide ($TiO_2$). More preferably, the insulating film 50f may be transparent while being made of the above component, but is not limited thereto. When the insulating film 50f is transparent, it is possible to minimize a decrease in luminous efficiency of the element that may be exhibited when the insulating film 50f is coated on the element to perform the above-described roles. According to a preferred embodiment of the present invention, the insulating film 50f may have a thickness of 5 to 50 nm, but is not limited thereto.

Next, the metal caps 50d and 50e formed at one or more end parts of the nano-scale LED element will be described.

Each of the metal caps partially covers a side part that extends from the end part in order to further increase a surface area of the end part of the nano-scale LED element while covering the end part of the element. In this case, an outer surface of the metal cap is at least partially curved.

Figure 6:
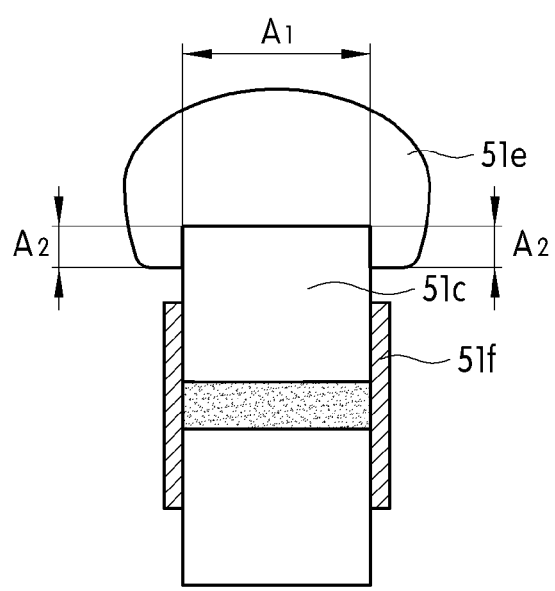
FIG. 6 is a longitudinal sectional view of a nano-scale LED element according to a preferred embodiment of the present invention.

In detail, FIG. 6 is a longitudinal sectional view of a nano-scale LED element according to a preferred embodiment of the present invention and shows a metal cap 51e formed at one end part of the element. In more detail, the metal cap 51e covers an end $A_1$ at one end part of the element and also a side part A₂ connected to the end A₁, and the metal cap 51*e* does not cover an insulating film 51*f*, but covers an outer side surface of a second semiconductor layer 51*c*. Also, a sectional outline of the metal cap 51*e* includes a curved line, and thus an outer surface of the metal cap 51*e* includes a curved surface.

When the above-described insulating film 51*f* is formed to cover an outer surface of the element, which includes an outer surface of the active layer, the metal cap 51*e* may be formed to partially cover an outer surface of the insulating film 51*f*.

Figure 7:
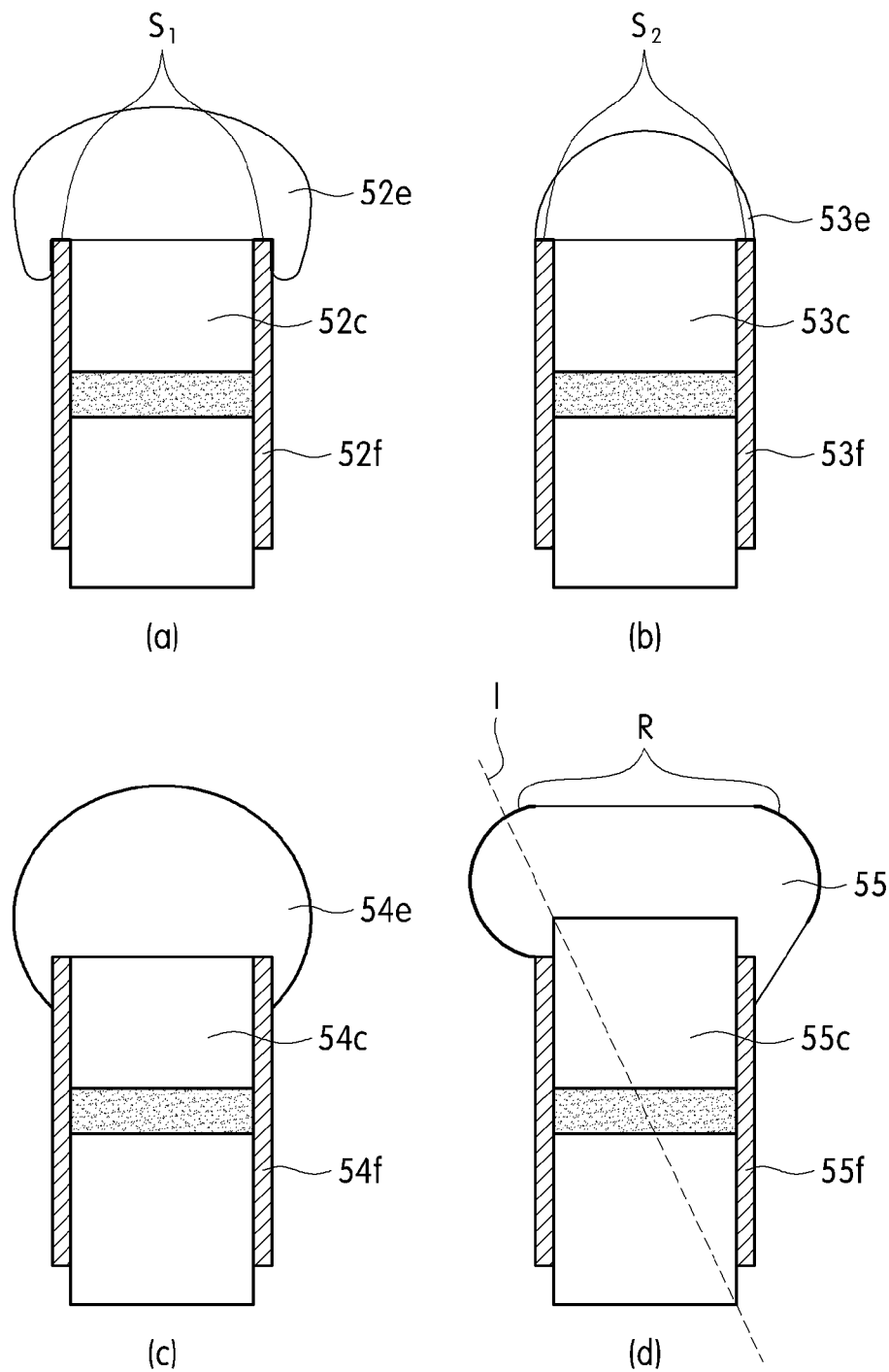
FIG. 7 is a longitudinal sectional view of a nano-scale LED element shaped like a swab according to a preferred embodiment of the present invention.

In detail, FIG. 7 is a longitudinal sectional view of a nano-scale LED element according to another preferred embodiment of the present invention and shows metal caps 52*e*, 53*e*, 54*e*, and 55*e* formed at one end part of the element. Inner surfaces of the metal caps 52*e* and 53*e* of FIGS. 7A and 7B are in contact with insulating films 52*f* and 53*f* to cover some outer surfaces S₁ and S₂ of the insulating films 52*f* and 53*f* and top surfaces (ends) of second semiconductor layers 52*c* and 53*c*. Also, sectional outlines of the metal caps 52*e* and 53*e* of FIGS. 7A and 7B include curved lines, and thus outer surfaces of the metal caps 52*e* and 53*e* include curved surfaces.

Also, a curved surface may be formed over the metal cap 54*e* as in a nano-scale LED element of FIG. 7C, and may be formed at a portion of the metal cap 55*e* as in a nano-scale LED element of FIG. 7D. In more detail, the nano-scale LED element of FIG. 7D shows that portions R of a longitudinal cross-section positioned in diagonal directions of the element are curved.

In the nano-scale LED element according to the present invention, the outer surface of the metal cap is at least partially curved. Preferably, a curved portion thereof may be a region through which a virtual diagonal extension line (1 of FIG. 7D) passes in the longitudinal cross-section of the nano-scale LED element. In detail, the virtual extension line 1 in FIG. 7D passes through the curved portion of the metal cap 55*e*. In the case in which at least a portion of the outer surface of the metal cap, in particular, an outer surface of the metal cap positioned in a diagonal direction of the element in the longitudinal cross-section of the element, is curved, the nano-scale LED element is easily arranged to be perpendicular to two different electrodes when the nano-scale LED element is self-aligned under an electric field and connected to the electrodes. Accordingly, this may be very advantageous in performing arrangement so that one LED element occupies a minimum area in the electrode region, and thus it is possible to mount a larger number of LED elements in the electrode region. According to another preferred embodiment of the present invention, an entirety of the outer surface of the metal cap may be curved as shown in FIG. 7A to 7C.

Figure 8:
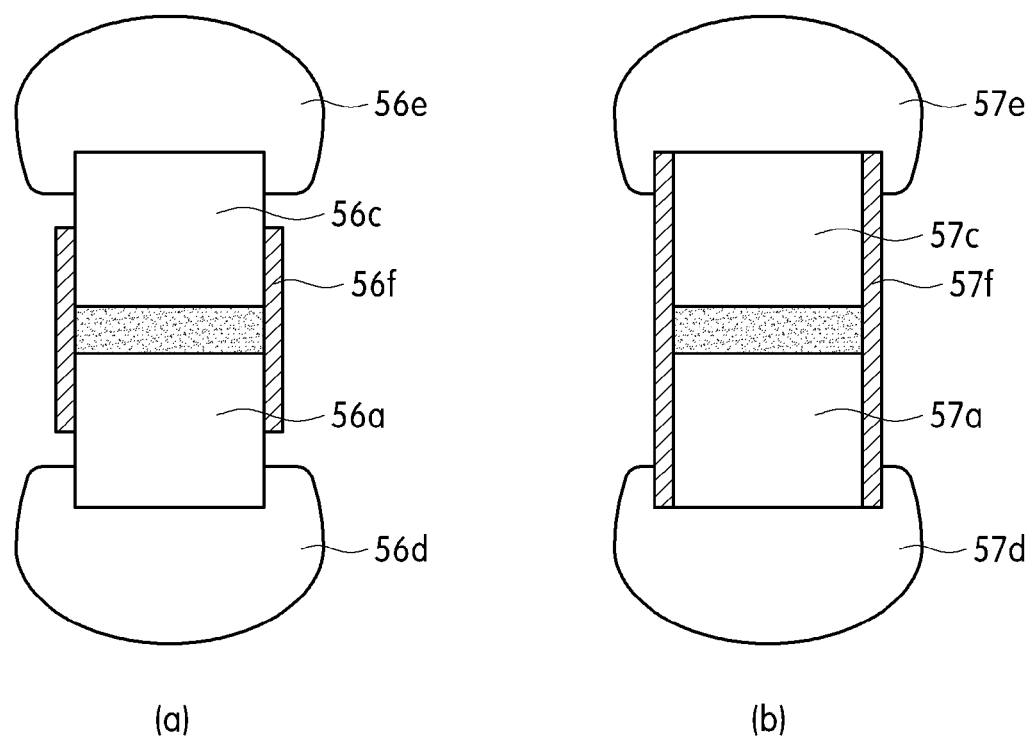
FIG. 8 is a longitudinal sectional view of a nano-scale LED element shaped like a dumbbell according to a preferred embodiment of the present invention.

According to still another preferred embodiment of the present invention, the metal cap may be formed at both end parts of the nano-scale LED element. In detail, FIG. 8 is a longitudinal sectional view of a nano-scale LED element according to a preferred embodiment of the present invention and shows a first metal cap 55*d* that does not cover an outer surface of an insulating film 56*f* but covers a bottom surface (an end) of a first conductive semiconductor layer 56*a* of the nano-scale LED element and a side surface connected to the bottom surface, wherein the metal cap has an outer surface that is at least partially curved, and a second metal cap 56*e* that does not cover the outer surface of the insulating film 56*f* but covers a top surface (an end) of a second conductive semiconductor layer 56*c* and a side surface connecting to the top surface, wherein the metal cap has an outer surface that is at least partially curved.

Also, FIG. 8B shows a first metal cap 57*d* that is in contact with a bottom surface of a first conductive semiconductor layer 57*a* of a nano-scale LED element and partially covers an insulating film 57*f*, wherein the metal cap has an outer surface that is at least partially curved, and a second metal cap 57*e* that is in contact with a top surface of a second insulating film 57*c* and partially covers the insulating film 57*f*, wherein the metal cap has an outer surface that is at least partially curved.

As described above, the metal caps included in the nano-scale LED element according to the present invention have outer surfaces that are at least partially curved. Accordingly, according to a preferred embodiment of the present invention, the nano-scale LED element may have a swab-shaped cross-section in a direction perpendicular to the semiconductor layers as shown in FIG. 5A (or FIG. 6 and FIG. 7) or a dumbbell-shaped cross-section in a direction perpendicular to the semiconductor layer as shown in FIG. 5B (or FIG. 8).

Because a metal cap shaped like as described above is formed at one or more end parts of the nano-scale LED element, a surface area of a region of a conventional LED element that may be polarized under an electric field significantly increases, and thus a surface of the metal cap may be electrically charged with a larger number of positive electric charges or negative electric charges. Accordingly, it is possible to improve self-alignment of the nano-scale LED element on an electrode assembly and also facilitate positional alignment. Thus, an area ratio between a sectional area of an end of an end part of the nano-scale LED element and a surface area of the metal cap may be within a range from 1:1.1 to 1:10.0, preferably from 1:1.1 to 1:5, and more preferably from 1:1.1 to 1:3. When the area ratio is less than 1:1.1, an improvement effect that may be obtained by including the metal cap is insignificant, and the metal cap may not appropriately perform its function. On the other hand, when the area ratio is greater than 1:10, it may be difficult to implement a nano-scale LED because the metal cap is significantly increased in a long axis direction and/or a short axis direction, and it may also be impossible to increase the number of nano-scale LED elements that are included in a limited electrode region because a volume occupied by one LED element increases.

Figure 9:
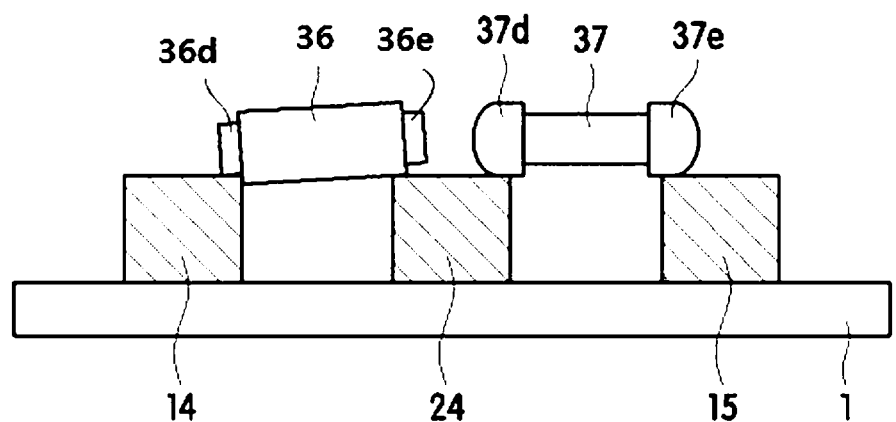
FIG. 9 is a sectional view of a horizontal array assembly according to a preferred embodiment of the present invention.

Also, when a horizontal array assembly is implemented through a nano-scale LED element having a metal cap with the above-described shape, a horizontal array assembly that sufficiently achieves positional alignment and electrical connectivity through target self-alignment may be implemented as desired without needing to finely adjust conditions such as a width of an electrode of the assembly, a distance between electrodes, a length of the nano-scale LED element, and a thickness of an exposed part that is not coated with the insulating film of the element to accurately coordinate the conditions. In detail, FIG. 9 is a sectional view of a horizontal array assembly according to a preferred embodiment of the present invention. Nano-scale LED elements 36 and 37 are connected to first electrodes 14 and 15 formed on a base substrate 1, and a second electrode 24 is formed apart from the first electrodes 14 and 15 on the base substrate 1. The nano-scale LED element 36, which does not have a metal cap, is not electrically connected because an electrode layer or a semiconductor layer 36*d* at one side thereof is in direct contact with the first electrode 14 while an electrode layer or a semiconductor layer 36*e* at the other side thereof is not in direct contact with the second electrode 24. In order to solve such a problem, it is necessary for a process of adjusting conditions such as a distance between the two different electrodes 14 and 24, a length of the nano-scale LED element 36, and a length of an insulating-film-uncoated part 36d, and coordinating the conditions. However, it is very difficult to coordinate all of the conditions for a horizontal array assembly based on a nano- or micro-scale. On the other hand, it can be seen that the element 37, which includes metal caps 37d and 37e, according to the present invention, among the nano-scale LED elements of FIG. 9, may be easily electrically connected to the two different electrodes 15 and 24 by the metal caps 37d and 37e, which are formed at both end parts, without needing to coordinate all of the conditions.

The metal caps 50d and 50e may be made of any one of gold (Au), copper (Cu), silver (Ag), nickel (Ni), cobalt (Co), platinum (Pt), chromium (Cr), titanium (Ti), aluminum (Al), nickel (Ni), and palladium (Pd), an oxide thereof, or an alloy of two or more thereof. When the nano-scale LED element includes metal caps at both end parts thereof, the metal caps may have the same or different materials.

Figure 17:
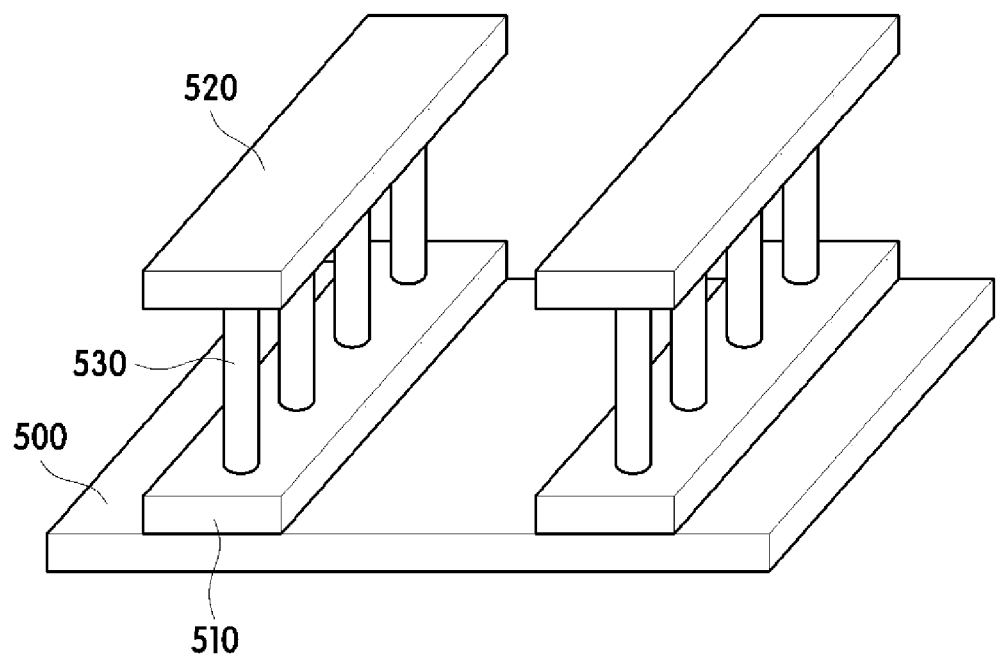
FIG. 17 is a perspective view of a conventional assembly having a vertical structure.

The use of the nano-scale LED element according to the present invention will be described in detail. The nano-scale LED element according to a preferred embodiment of the present invention is used for a horizontal array assembly. That is, the nano-scale LED element is suitable for an assembly in which an element is laid on a ground surface in a length direction perpendicular to each semiconductor layer of the element and connected to two different electrodes at both end parts thereof, but may not be used for an assembly having a vertical structure in which the nano-scale LED element is mounted on the electrodes to stand upright in a length direction in three dimensions. In detail, FIG. 17 is a perspective view of a conventional assembly having a vertical structure and shows a first electrode 510 formed on a base substrate 500, a second electrode 520 formed above the first electrode 510, and a nano-scale LED element 530 disposed between the first electrode 510 and the second electrode 520 to stand upright in a length direction of the element in three dimensions. Actually, except for growing nano-scale LED element on a first electrode, it is very difficult to individually connect nano-scale LED elements that are separately manufactured in the length direction to stand upright in order to the assembly of the vertical structure as shown in FIG. 17. Also, although an electric field is formed perpendicularly to nano-scale LED elements that lie on a ground surface of an assembly, the nano-scale LED elements may not be self-aligned to stand upright in a length direction in three dimensions. Accordingly, the nano-scale LED element according to the present invention may be suitable for a horizontal array assembly in which an element is self-aligned by an influence of an electric field and connected to two different electrodes horizontally to a ground surface.

The nano-scale LED element according to a preferred embodiment of the present invention, which has been described above, may be manufactured through a manufacturing method thereof. However, the manufacturing method is not limited thereto.

The nano-scale LED element according to a preferred embodiment of the present invention may be manufactured by a method including steps of: (1) etching a laminate having a first conductive semiconductor layer, an active layer, and a second conductive semiconductor layer sequentially stacked on a substrate so that an element has a nano- or micro-scale diameter; (2) forming an insulating film on an outer surface of the etched laminate including the first conductive semiconductor layer, the active layer, and the second conductive semiconductor layer; and (3) removing the insulating film to expose a part of an outer surface including a top surface of the second conductive semiconductor layer, forming a metal cap on the exposed outer surface of the second conductive semiconductor layer, and then removing the substrate.

First, the step of etching a laminate having a first conductive semiconductor layer, an active layer, and a second conductive semiconductor layer sequentially stacked on a substrate so that an element has a nano- or micro-scale diameter is performed as step (1).

Figure 10:
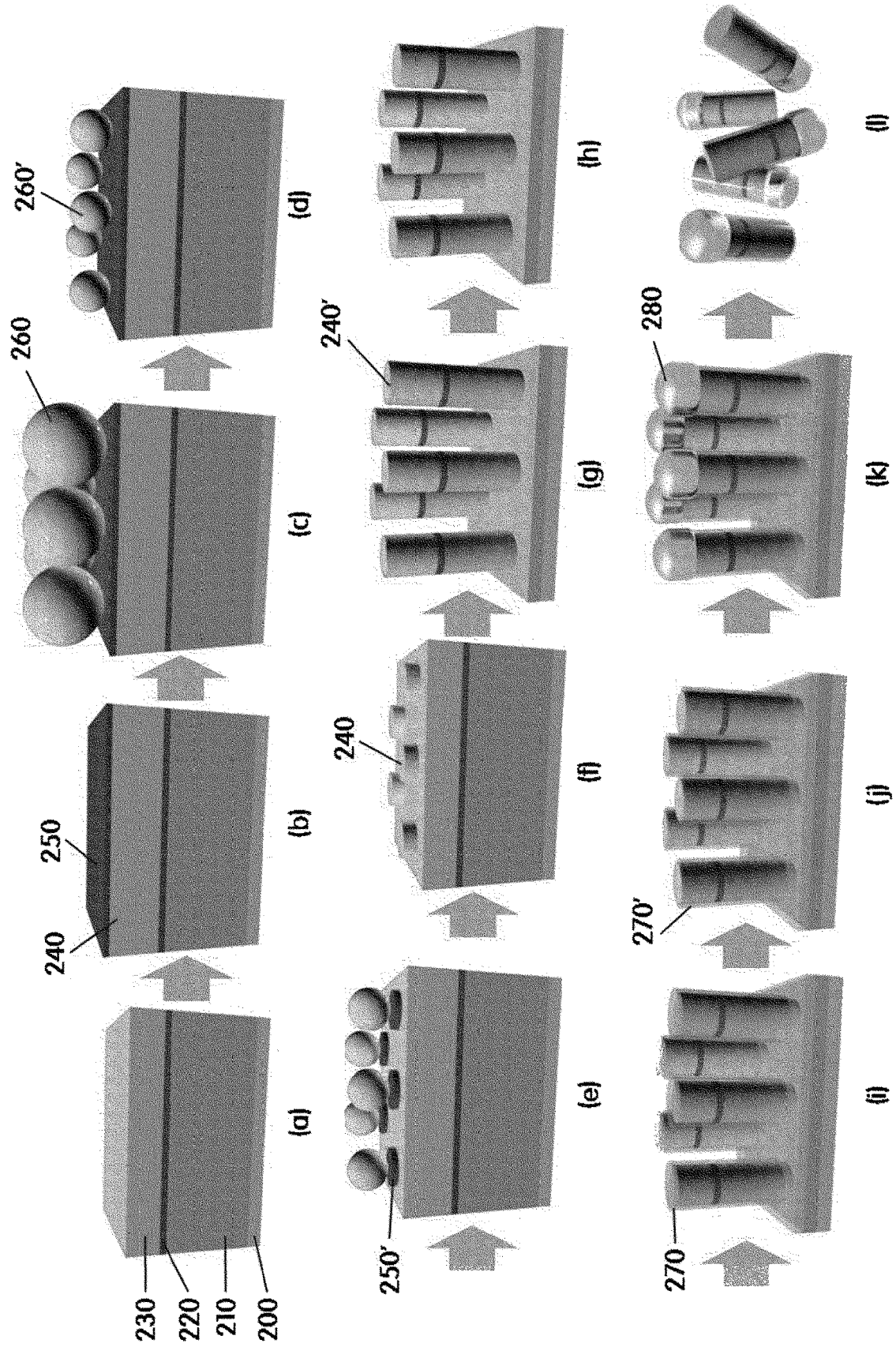
FIG. 10 is a perspective view showing a process of manufacturing a nano-scale LED element according to an embodiment of the present invention.

In order to manufacture the laminate, the first conductive semiconductor layer, the active layer, and the second conductive semiconductor layer are sequentially formed on the substrate. In detail, FIG. 10 is a perspective view showing a process of manufacturing a nano-scale LED element according to an embodiment of the present invention, and FIG. 10A shows a first conductive semiconductor layer 210, an active layer 220, and a second conductive semiconductor layer 230 stacked sequentially on a substrate 200. Any one of the first conductive semiconductor layer 210 and the second conductive semiconductor layer 230 may include at least one n-type semiconductor layer, and the other one may include at least one p-type semiconductor layer.

The substrate 200 may include a sapphire substrate ($Al_2O_3$) and a transparent substrate such as glass. Also, the substrate 200 may be selected from a group including GaN, SiC, ZnO, Si, GaP, and GaAs substrates and a conductive substrate. A square wave pattern may be formed on a top surface of the substrate 200.

A nitride semiconductor is grown on the substrate 200, and an apparatus for the growth may include an electron beam deposition apparatus, a physical vapor deposition (PVD) apparatus, a chemical vapor deposition (CVD) apparatus, a plasma laser deposition (PLD) apparatus, a dual-type thermal evaporator, a sputtering apparatus, and a metal organic chemical vapor deposition (MOCVD) apparatus, but the apparatus is not limited thereto.

A buffer layer (not shown) and/or an undoped semiconductor layer (not show) may be formed on the substrate 200. The buffer layer is a layer for reducing a lattice constant difference with the substrate 200 and may be formed of at least one of GaN, InN, AlN, InGaN, AlGaN, InAlGaN, and AlInN. The undoped semiconductor layer may be implemented as an undoped GaN layer and function as a substrate on which the nitride semiconductor is grown. Only one, both, or neither of the buffer layer and the undoped semiconductor layer may be formed. According to a preferred embodiment of the present invention, the substrate 200 may have a thickness of 400 to 1500 µm, but is not limited thereto.

Detailed descriptions of the first conductive semiconductor layer 210, the active layer 220, and the second conductive semiconductor layer 230 that are sequentially stacked on the substrate 200 are the same as those of the nano-scale LED element according to a preferred embodiment of the present invention, and thus will be omitted.

Next, as described above, the etching of the laminate having the first conductive semiconductor layer, the active layer, and the second conductive semiconductor layer sequentially stacked on the substrate so that the element has a nano- or micro-scale diameter is performed.

To this end, according to a preferred embodiment of the present invention, the etching may include steps of: 1-1) sequentially stacking the first conductive semiconductor layer, the active layer, and the second conductive semiconductor layer on the substrate; 1-2) forming an insulating layer and a metal mask layer on the second conductive semiconductor layer; (1-3) forming a nano-sphere or micro-sphere monolayer film on the metal mask layer and performing self-assembly; and 1-4) etching the first conductive semiconductor layer, the active layer, and the second conductive semiconductor layer on a nano- or micro-scale according to a pattern.

The insulating layer and the metal mask layer may be formed on the second conductive semiconductor layer (step 1-2)) after the first conductive semiconductor layer, the active layer, and the second conductive semiconductor layer are formed on the substrate (step 1-1)). In detail, FIG. 10B shows an insulating layer 240 and a metal mask layer 250 that are sequentially formed on the second conductive semiconductor layer 230.

The insulating layer 240 may serve as a mask for continuously etching the second conductive semiconductor layer, the active layer, and the first conductive semiconductor layer, and may use an oxide or a nitride. As a non-limiting example, the oxide or the nitride may include, but is not limited to, a silicon oxide ($SiO_2$ or $SiO_x$) and/or a silicon nitride ($Si_3N_4$ or $SiN_x$). According to a preferred embodiment of the present invention, the insulating layer may have a thickness of 0.5 to 1.5 µm, but is not limited thereto.

The metal mask layer 250 formed on the insulating layer 240 serves as a mask layer for the etching and may use a metal that is typically used. As a non-limiting example, the metal may include, but is not limited to, chromium (Cr). According to a preferred embodiment of the present invention, the metal mask layer may have a thickness of 30 to 150 nm, but is not limited thereto.

Next, the step of forming a nano-sphere or micro-sphere monolayer film 260 on the metal mask layer 250, and then self-assembly may be performed as step 1-3).

In detail, FIG. 10C shows a sectional perspective view of the nano-sphere or micro-sphere monolayer film 260 formed on the metal mask layer 250 of the present invention. The nano-sphere or micro-sphere monolayer film 260 is formed to serve as a mask for the etching of the metal mask layer 250, and a method of forming sphere particles may use self-assembly characteristics of a sphere. In order to form a complete one-layer structure arrangement through self-assembly of spheres, the spheres are made to float on a water surface at certain speed and perform self-assembly. Since a sphere region formed while the spheres are spread on water is small and irregular, additional energy and a surfactant may be applied to form a single sphere layer having a large and regular arrangement. Then, the single sphere layer may be lifted onto the metal mask layer 250 to form a sphere monolayer film that is regularly arranged on a metal layer. The sphere may have a particle diameter that may be used selectively depending on a desired diameter of a nano-scale LED element intended to be finally manufactured. Preferably, the sphere may include a polystyrene sphere, a silica sphere, etc. having a diameter of 50 to 3000 nm, but the sphere is not limited thereto.

Next, the step of etching the first conductive semiconductor layer, the active layer, and the second conductive semiconductor layer on a nano- or micro-scale according to a pattern may be additionally performed as step 1-4).

FIGS. 10D to 10F show a pattering process for etching on a nano- or micro-scale. FIG. 10D is a sectional perspective view of the nano-sphere or micro-sphere monolayer film 260 formed on the metal mask layer 250 after an ashing process. Through the ashing process, sphere particles may be separated a certain distance from each other to achieve a desired diameter of the LED element. Preferably, the distance may range from 50 nm to 3000 nm.

The ashing process may be accomplished through a typical ashing process of a sphere monolayer film. Preferably, the ashing process may be performed through plasma ashing and reactive ion ashing based on oxygen ($O_2$).

FIG. 10E shows a sectional perspective view of a metal mask layer 250' etched using a sphere particle as a mask, and FIG. 10F shows an insulating layer 240' etched using the etched metal mask layer 250' as a mask after a sphere particle 260' is removed. Subsequently, as shown in FIG. 10G, the first conductive semiconductor layer, the active layer, and the second conductive semiconductor layer may be etched to a desired depth by using the etched insulating layer 240' as a mask. Then, as shown in FIG. 10H, an etched laminate may be manufactured by removing the insulating layer 240'.

The etching process and the removal of the sphere particle/metal mask layer/insulating layer of FIG. 10E to 10G may be performed by a typical etching process. In this case, a dry etching method or a wet etching method may be implemented alone or in combination. In detail, a dry etching method such as reactive ion etching (RIE) or inductively coupled plasma reactive ion etching (ICP-RIE) may be used for the etching process. Unlike the wet etching method, the dry etching method is capable of unidirectional etching and is suitable to form such a pattern. That is, the wet etching method performs isotropic etching in which etching is performed in every direction while the dry etching method is capable of etching in a depth direction to form a hole. In this case, the hole may have a size, a distance, or the like formed in a desired pattern. In this case, when RIE or ICP-RIE is used, $Cl_2$, $O_2$, or the like may be used as an etching gas for etching the metal mask.

According to another preferred embodiment of the present invention, step 1 may include steps of: 1-1) manufacturing the laminate by sequentially stacking the first conductive semiconductor layer, the active layer, and the second conductive semiconductor layer on the substrate; 1-2) forming an insulating layer and a metal mask layer on the second conductive semiconductor layer; 1-3) forming a polymer layer on the metal mask layer and forming a pattern on the polymer layer on a nano- or micro-scale; 1-4) etching the first conductive semiconductor layer, the active layer, and the second conductive semiconductor layer on a nano- or micro-scale according to the pattern; and 1-5) removing the insulating layer, the metal mask layer, and the polymer layer.

In detail, step 1 may be accomplished by forming the insulating layer and the metal mask layer on the second conductive semiconductor layer, forming a typical polymer layer that may be used in typical lithography or the like on the metal mask layer, forming a pattern on the polymer layer on a nano- or micro-scale through a method such as photolithography, e-beam lithography, or nano-imprint lithography, performing dry etching or wet etching, and removing the polymer layer, the metal mask layer, and the insulating layer.

Next, the step of forming an insulating film on an outer surface of the etched laminate including the first conductive semiconductor layer, the active layer, and the second conductive semiconductor layer is performed as step (2).

In detail, FIG. 10I shows an etched laminate having an outer surface coated with an insulating film 270. The coating with the insulating film may use a method of applying an insulating material onto the outer surface of the etched laminate or immersing the etched laminate, but is not limited thereto. Preferably, a material that may be used as the insulating film may include one or more selected from a group consisting of $SiO_2$, $Si_3N_4$, $Al_2O_3$, and $TiO_2$, but is not limited thereto. Preferably, the insulating material may be $Al_2O_3$. Such an insulating material may form the insulating film on the outer surface of the etched laminate through atomic layer deposition (ALD) and may form a thin film using Chemical adsorption and desorption by supplying trimethyl aluminum (TMA) and $H_2O$ source in the form of a pulse. According to a preferred embodiment of the present invention, the formed insulating film may have a thickness of 5 to 50 nm.

Next, the step of removing the insulating film to expose a part of an outer surface including a top surface of the second conductive semiconductor layer, forming a metal cap on the exposed outer surface of the second conductive semiconductor layer, and then removing the substrate is performed as step (3).

In step (3), a method of forming the metal cap on the outer surface of the second conductive semiconductor layer may use a deposition method, preferably electrochemical vapor deposition. According to a preferred embodiment of the present invention, step 3 may include steps of: 3-1) removing the insulating film to expose a part of the outer surface of the second conductive semiconductor layer including a top surface of the second conductive semiconductor layer; 3-2) immersing the etched laminate in an electrolytic plating solution and applying power to the laminate to form a metal cap on the exposed outer surface of the second conductive semiconductor layer through plating; and 3-3) removing the substrate from the laminate.

First, the step of removing the insulating film to expose the part of the outer surface of the second conductive semiconductor layer including the top surface of the second conductive semiconductor layer may be performed as step 3-1).

The removal of the insulating film may be performed through a typical etching method, and may be preferably performed through directional etching. A detailed method thereof may be compliant with a typical method well known in the art. In this case, by considering a sectional shape, a surface area, etc. of a target metal cap that are desired, the top surface of the second conductive semiconductor layer or even a part of a side surface connected to the top surface may be etched when the insulating film is etched. However, it may be preferable not to expose even a part of the side surface of the second conductive semiconductor layer adjacent to the active layer in order to prevent electrical shorts due to direct contact between the electrode and the active layer. In detail, FIG. 10J shows that only the outer surface of the etched laminate, excluding the top surface of the second semiconductor layer, is coated with the insulating film 270' by removing an insulating film of the top surface of the second conductive semiconductor layer.

Subsequently, the step of immersing the etched laminate in an electrolytic plating solution and applying power to the laminate to form a metal cap on the exposed outer surface of the second conductive semiconductor layer through plating may be performed as step 3-2).

The electrolytic plating solution is a solution including a material for forming a desired metal cap, and may be composed differently depending of the material of the metal cap. As a representative example, an electrolytic plating solution that may be used when the metal cap is formed with gold (Au) may be a mixed plating solution containing $HAuCl_4$, HCl, DI water, and a $KAuCl_4$ plating solution. In this case, the concentration of Au may be designed differently in consideration of an electroplating time and a size of a metal cap to be formed, and thus the present invention has no special limitation thereon. However, preferably, the concentration of Au may range from 0.005 wt % to 50 wt %.

The exposed outer surface of the second conductive semiconductor layer may be plated with a metal cap forming material by immersing the laminate including the exposed surface of the second conductive semiconductor layer in the above-described electrolytic plating solution. In detail, the electroplating may be performed by attaching an electrode to the substrate of the laminate and applying power to the laminate. In order to easily form the metal cap, it is preferable that the substrate be a conductive substrate. A detailed electroplating method may use a typical method in the art, and thus the present invention has no special limitation thereon. However, it is preferable that the metal cap be formed by applying power with a −0.2 to −1.0 V direct current for 10 to 55 minutes. When the power is applied for less than 10 minutes, it may be difficult to form a metal cap having a sufficient surface area and a desired sectional shape. When the power is applied for more than 55 minutes, electrical shorts may occur in the electrode.

The above-described metal cap forming method is not necessarily limited to the electroplating method. The metal cap may also be formed through thermal evaporation, e-beam evaporation, sputtering, etc.

In detail, FIG. 10K shows a metal cap 280 formed in a part of an outer surface of an end part of the element, which includes a top surface of the second conductive semiconductor layer that is not coated with the insulating film through the above method.

Subsequently, when the step of removing the substrate from the laminate as shown in FIG. 10I is performed as step 3-3), a nano-scale LED element having a swab-shaped cross-section may be manufactured.

Preferably, the substrate may be removed by attaching a support film to a top of the metal cap and applying a typical method such as laser lift off (LLO). It is possible to prevent cracking of the LED element that may occur while removing the substrate. The support film may be a polymer epoxy or a bonding metal and have a thickness of 0.3 to 70 μm, but is not limited thereto.

According to another preferred embodiment of the present invention, in order to manufacture an LED element having a dumbbell-shaped cross-section in which metal caps are formed at both end parts of the LED element, step (3) may include steps of: 3-1) removing the insulating film to expose a part of the outer surface including the top surface of the second conductive semiconductor layer; 3-2) immersing the etched laminate in an electrolytic plating solution and applying power to the laminate to form a metal cap on the exposed outer surface of the second conductive semiconductor layer through plating; 3-3) forming a support film above the metal cap and removing the substrate from the laminate; and 3-4) immersing the laminate from which the substrate has been removed in an electrolytic plating solution and applying power to the laminate to form a metal cap on an exposed partial outer surface including a bottom surface of the first conductive semiconductor layer and then removing the support film.

The description of steps 3-1) and 3-2) is the same as that of the method of manufacturing an LED element shaped like a swab, and thus will be omitted.

After a metal cap is formed on the exposed outer surface of the second conductive semiconductor layer, the step of forming a support film above the metal cap and removing the substrate from the laminate may be performed as step 3-3).

Figure 11:
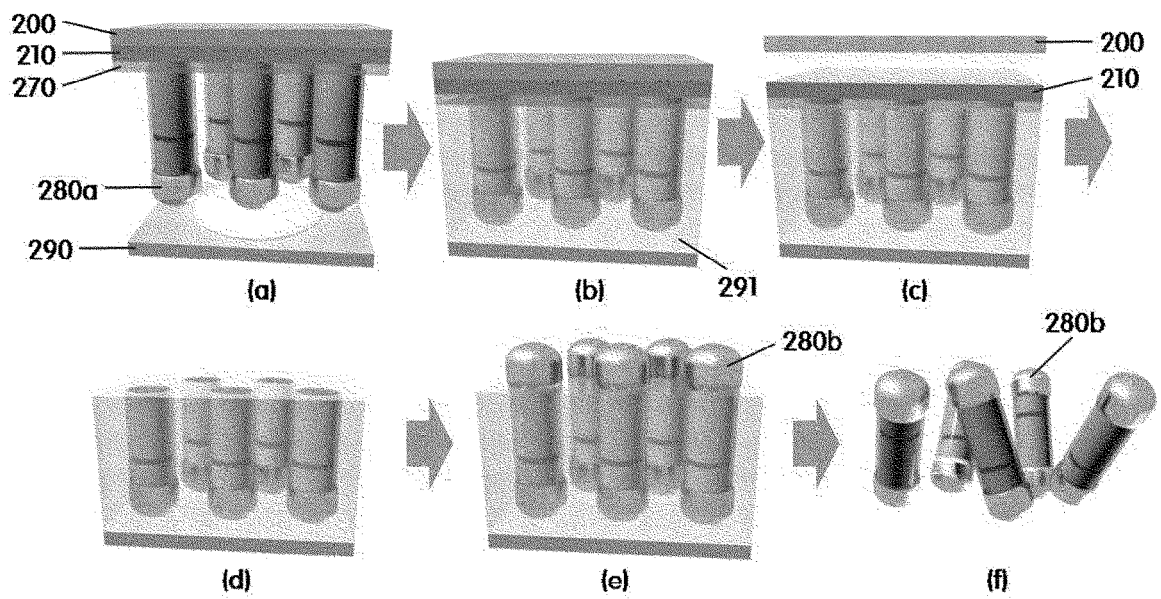
FIG. 11 is a perspective view showing a process of manufacturing a nano-scale LED element according to an embodiment of the present invention.

In detail, FIG. 11 is a perspective view showing a process of manufacturing a nano-scale LED element according to an embodiment of the present invention, and FIG. 11A shows that a support film 290 is attached to a bottom of a metal cap 280a formed at one end part of the LED element in the laminate manufactured through step 3-2). Subsequently, in order to increase a supporting force of the LED element, a support polymer 291 may be filled in a space between the support film 290 and the laminate as shown in FIG. 11B. A support polymer that is well known and customarily used may be used as the support polymer, and thus there is no limitation in the type of support layer in the present invention.

Subsequently, the bottom surface of the first conductive semiconductor may be exposed as shown in FIG. 11D by removing the substrate 200 and removing the first conductive semiconductor layer 210 that is formed below the substrate 200 and is not etched as shown in FIG. 11C. The removal of the first conductive semiconductor layer 210 that is not etched may be performed using a well-known method in the art such as ultrasonic irradiation or dry etching.

Next, the step of immersing the laminate from which the substrate has been removed in an electrolytic plating solution and applying power to the laminate to form a metal cap on an exposed part of the outer surface including the bottom surface of the first conductive semiconductor layer through plating and then removing the support film may be performed as step 3-4).

A detailed description of the plating through the electrolytic plating solution is the same as described above, and thus will be omitted. When the exposed surface of the first conductive semiconductor layer, which is not coated with the insulating film, is plated with metal cap forming material, a metal cap 280b may be formed at one end part of the element in a direction of the first conductive semiconductor layer as shown in FIG. 11E. Subsequently, when the support polymer and the support film are removed, a nano-scale LED element having a dumbbell-shaped cross-section including the metal caps 280a and 280b at both end parts thereof may be manufactured as shown in FIG. 11F.

The present invention includes a horizontal array assembly including the above-described nano-scale LED device for the horizontal array assembly according to a preferred embodiment of the present invention.

A horizontal array assembly for a nano-scale LED that is horizontally arranged according to a preferred embodiment of the present invention may include a base substrate, an electrode line including a first electrode formed on the base substrate and a second electrode formed apart from and co-planar to the first electrode, and a plurality of nano-scale LED elements connected to both the first electrode and the second electrode.

Figure 12:
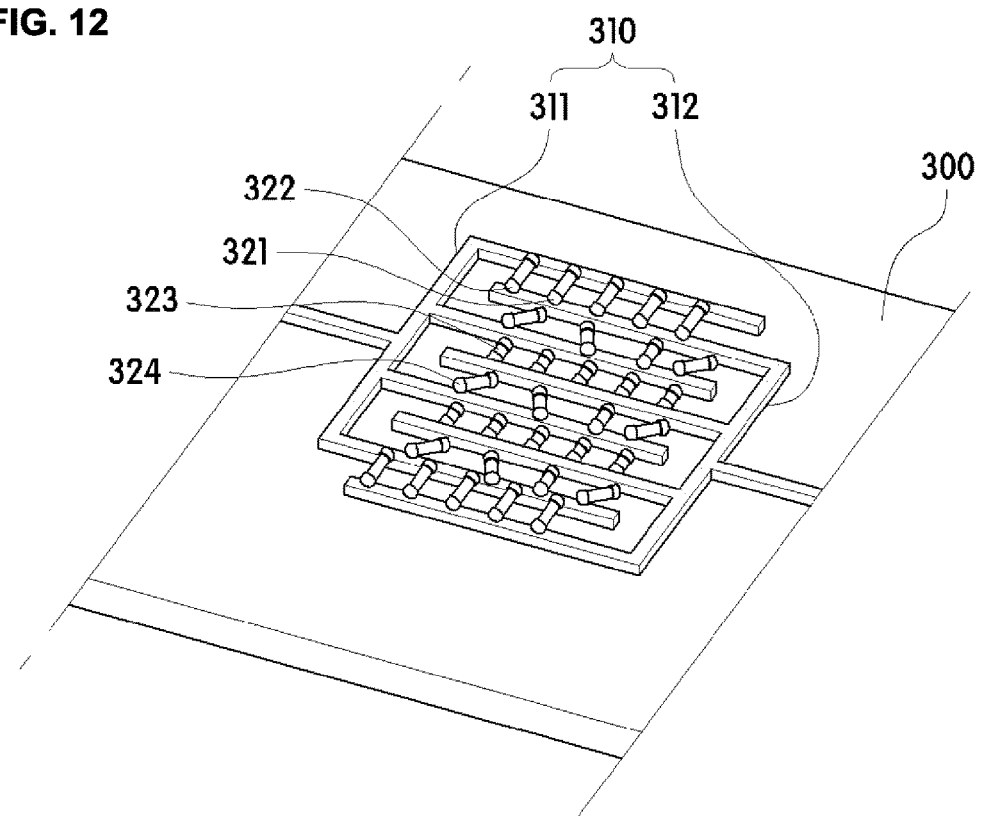
FIG. 12 is a perspective view of a horizontal array assembly according to a preferred embodiment of the present invention.

In detail, FIG. 12 is a perspective view of a horizontal array assembly for a nano-scale LED which is horizontally arranged according to a preferred embodiment of the present invention, and shows an electrode line 310 including a first electrode 110 formed on a base substrate 300 and a second electrode 312 formed apart from the first electrode 311 on the base substrate 300 and nano-scale LED elements 321, 322, 323, and 324 connected to both the first electrode 311 and the second electrode 312.

First, the base substrate 300 and the electrode line 310 including the first electrode 311 formed on the base substrate 300 and the second electrode 312 formed apart from the first electrode 311 on the base substrate 300 will be described.

Here, "on the base substrate" refers to the first electrode 311 and the second electrode 312 being formed directly above the base substrate or the first electrode 311 and/or the second electrode 312 being formed apart from the base substrate. The base substrate serves as a supporting body for the horizontal array assembly. As long as an electrode can be typically formed on a base substrate, the base substrate may be used as the base substrate 300 according to the present invention without limit. As a non-limiting example, the base substrate 300 may be any one of a glass substrate, a quartz substrate, a sapphire substrate, a plastic substrate, and a foldable flexible polymer film. More preferably, the substrate may be transparent. An area of the base substrate has no limitation and may be changed in consideration of areas of the first electrode and the second electrode that will be formed on the base substrate, a size of a nano-scale LED element connected to the first electrode and the second electrode, and the number of nano-scale LED elements that are connected. Preferably, the base substrate may have a thickness of 100 μm to 1 mm, but is not limited thereto.

The first electrode 311 and the second electrode 312 may be made of a material that is typically used as an electrode. As a non-limiting example, the first electrode 311 and the second electrode 312 may be independently made of one or more metal materials which are selected from a group consisting of aluminum, titanium, indium, gold, and silver or one or more transparent materials which are selected from a group consisting of Indium Tin Oxide (ITO), ZnO:Al, and a CNT-conductive polymer composite. When there are two or more types of electrode materials, the first electrode and/or the second electrode may preferably have a structure in which the two or more types of materials are stacked. More preferably, the first electrode and/or the second electrode may have a structure in which two types of materials, i.e., titanium and gold, are stacked. However, the materials of the first electrode and/or the second electrode are not limited to the above description. Also, the materials of the first electrode and/or the second electrode may be the same or different from each other.

A separated space, sizes, and detailed arrangement of the first electrode and the second electrode may be designed differently depending on a purpose thereof, and may be variously modified into all imaginable structural arrangements such as a vertical or alternate arrangement of two different electrodes, depending on the purpose.

According to a preferred embodiment of the present invention, the horizontal array assembly may include one or more first nano-scale LED elements connected to a top surface of one of the first electrode and the second electrode at one side thereof and connected to a top surface of the other electrode at the other side thereof; a second nano-scale LED element connected to a side surface of the first electrode at one side thereof and connected to a side surface of the second electrode facing the side surface of the first electrode at the other side thereof; and a third nano-scale LED element connected to the top surface of one of the first electrode and the second electrode at one side thereof and connected to the side surface of the other electrode at the other side thereof. In detail, the horizontal array assembly of FIG. 12 includes the first nano-scale LED elements 321 and 322 connected to the top surface of one of the first electrode 311 and the second electrode 312 at one sides thereof and connected to the top surface of the other electrode at the other sides thereof, wherein first nano-scale LED elements 321 and 322 have a swab-shaped cross-section and a dumbbell-shaped cross-section; the second nano-scale LED element 323 connected to the side surface of the first electrode 311 at one side thereof and connected to the side surface of the second electrode 312 facing the side surface of the first electrode 311 at the other side thereof; and the third nano-scale LED element 324 connected to the top surface of the first electrode 311 at one side thereof and the side surface of the second electrode 312 at the other side thereof.

Also, the above-described second nano-scale LED element may be disposed between two different electrodes to form a multilayer, and thus it is possible to significantly increase the number of nano-scale LED elements that are included per unit electrode area. In addition, when a metal cap having a cross-sectional shape according to the present invention is formed at one or both end parts of a nano-scale LED element, the element may be rotated in a separated space between the electrodes by an electric field and connect to side surfaces of the electrodes, and thus it is possible to easily make a length direction of the element be approximately perpendicular to side surfaces of the electrodes. Accordingly, a volume occupied by one LED element decreases, and a space in which other nano-scale LED elements can be disposed increases. Thus, it is possible to implement a horizontal array assembly having a good quantity of light by including a larger number of nano-scale LED elements in the space. To this end, according to a preferred embodiment of the present invention, a plurality of nano-scale LED elements included in a horizontal array assembly may be connected to one side surface of a first electrode at one sides thereof and one side surface of a second electrode facing the one side of the first electrode at the other sides thereof, and also may be disposed between two different electrodes to form a multilayer.

Figure 13:
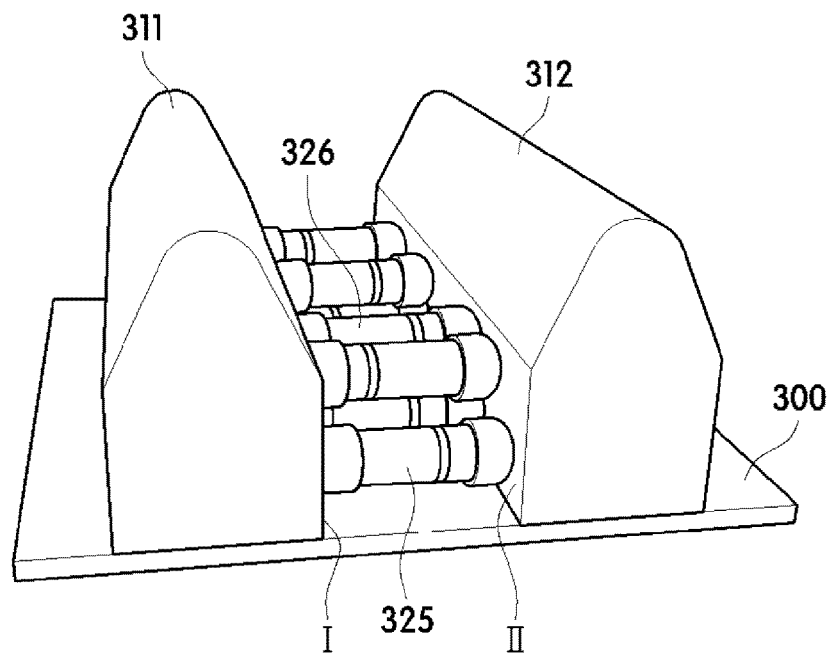
FIG. 13 is a perspective view of a horizontal array assembly according to a preferred embodiment of the present invention.

In detail, FIG. 13 is a perspective view of a horizontal array assembly according to a preferred embodiment of the present invention and shows a first electrode 311 formed on a base substrate 300, a second electrode 312 formed apart from the first electrode 311 on the base substrate 300 to have a side surface II facing a side surface I of the first electrode 311, and a plurality of nano-scale LED elements 325 and 326 brought into contact with the side surface I of the first electrode 311 at one ends thereof and the side surface II of the second electrode 312 at the other ends and disposed between the two electrodes to form a multi-layer. When a horizontal array assembly is implemented as shown in FIG. 13, it is possible to implement a horizontal array assembly that emits a significantly high quantity of light by including a large number of nano-scale LED elements in a limited electrode region.

The above-described horizontal array assembly according to a preferred embodiment of the present invention may be manufactured by a manufacturing method to be described below, but is not limited thereto.

A horizontal array assembly according to a preferred embodiment of the present invention may be manufactured by a method including steps of: (a) forming a first electrode on a base substrate and forming a second electrode apart from the first electrode on the base substrate; (b) providing a plurality of nano-scale LED elements, which include the nano-scale LED element for a horizontal array assembly according to the present invention, and a solvent to the first electrode and the second electrode; and (c) applying power to the first electrode and the second electrode to self-align the nano-scale LED elements so that the nano-scale LED elements are brought into contact with the first electrode at one ends thereof and brought into contact with the second electrode at the other ends.

In step (a), descriptions of the base substrate and the electrode are the same as described above. A method that is well known and customarily used in the art may be used to form the electrode on the base substrate, and thus the present invention has no special limitation thereon.

Next, the step of providing a plurality of nano-scale LED elements and a solvent to the first electrode and the second electrode is performed as step (b).

Figure 14:
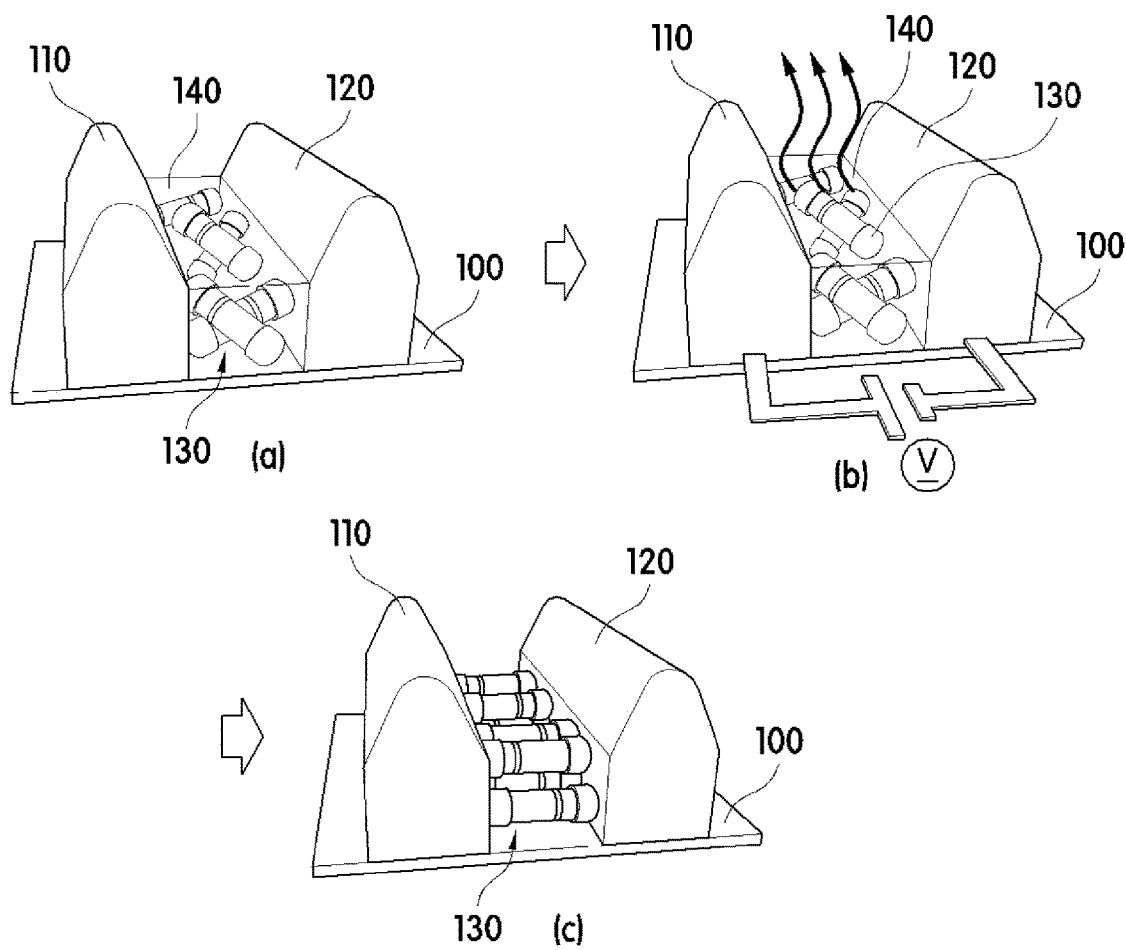
FIG. 14 is a perspective view showing a process of manufacturing a horizontal array assembly according to a preferred embodiment of the present invention.

In detail, FIG. 14 is a perspective view showing a process of manufacturing a horizontal array assembly according to a preferred embodiment of the present invention, and FIG. 14A shows nano-scale LED elements 130 and a solvent 140 that are provided to the first electrode 110 formed on the base substrate 100 and the second electrode 120 formed apart from the first electrode 110 on the base substrate 100.

The present invention has no limitation on a method of providing the nano-scale LED elements and the solvent to the first electrode and the second electrode. The nano-scale LED elements and the solvent may be simultaneously or sequentially provided regardless of their order. It is possible to mount the nano-scale LED elements on a target electrode region in a concentrated way by preferably providing the solvent after providing the nano-scale LED elements.

The solvent may preferably be one or more selected from a group consisting of acetone, water, alcohol, and toluene, and may more preferably be acetone. The type of solvent is not limited to the above description. As long as a solvent can be easily evaporated while not physically or chemically affecting the nano-scale LED elements, any solvent may be used without limitation.

Preferably, 0.001 to 100 parts by weight of the nano-scale LED elements may be provided per 100 parts by weight of the solvent. When less than 0.001 parts by weight of the nano-scale LED elements are provided, the number of nano-scale LED elements connected to an electrode is small and thus it may be difficult for an ultra-small LED electrode assembly to normally function. Accordingly, a solution should be added or dropped in order to overcome the difficulty. When more than 100 parts by weight of the nano-scale LED elements are provided, it is possible to disturb alignment of each of the nano-scale LED elements.

Next, the step of applying power to the first electrode and the second electrode to self-align the nano-scale LED elements so that the nano-scale LED elements are brought into contact with the first electrode at one ends thereof and brought into contact with the second electrode at the other ends is performed as step (c).

In detail, when the power is applied to the first electrode 110 and the second electrode 120 as shown in FIG. 14B, the nano-scale LED elements 130 perform self-alignment such as rotation or movement. Accordingly, it is possible to implement a horizontal array assembly in which the nano-scale LED elements 130 are connected to the first electrode 110 and the second electrode 120 such that one ends of the elements are brought into contact with the first electrode 110 and the other ends of the elements are brought into contact with the second electrode 120.

Figure 15:
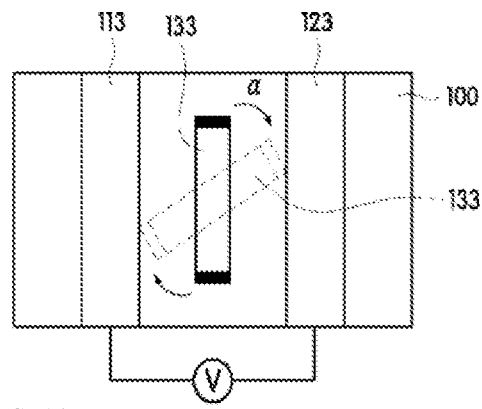
FIG. 15 is a plan view showing that a conventional nano-scale LED element performs self-alignment under an electric field.
Figure 16:
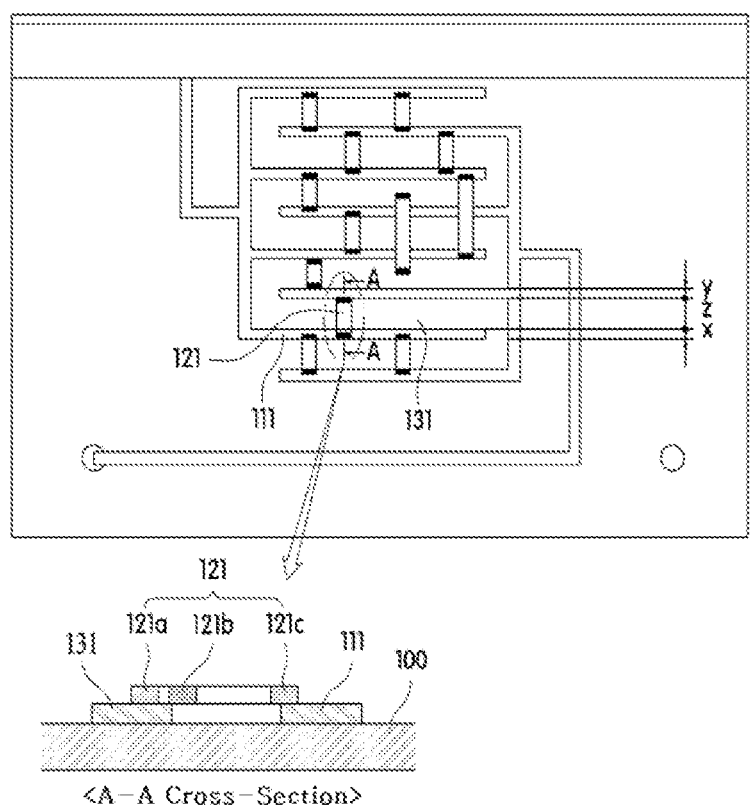
FIG. 16 is a plan view showing that nano-scale LED elements self-align under an electric field according to a preferred embodiment of the present invention.

When the nano-scale LED elements are self-aligned according to a preferred embodiment of the present invention, it is possible to enhance positional alignment and electrode connectivity. In detail, FIG. 15 is a plan view showing that conventional nano-scale LED elements are self-aligned under an electric field. When power is applied to a first electrode 113 and a second electrode 123 that are formed apart from each other on a base substrate 100, a nano-scale LED element 133 is rotated by an angle $\alpha$ so that both ends thereof move toward different electrodes. As shown in FIG. 15, since surface areas of both end parts of the nano-scale LED element 133, which is not coated with an insulating film, are very small, an influence caused by an electric field may be insignificant, and thus a greater electric field should be formed for the purpose of a change in position, such as movement or rotation of the nano-scale LED element 133. Also, when an outer surface of an exposed part that is not coated with the insulating film, in particular, an outer surface positioned in a diagonal direction of the element in a cross-section, is not curved, it may be difficult for the element to be oriented perpendicular to a surface of an electrode when one end part of the element is brought into contact with the electrode. On the other hand, FIG. 16 is a plan view showing that nano-scale LED elements are self-aligned according to a preferred embodiment of the present invention. When power is applied to a first electrode 114 and a second electrode 124 that are formed apart from each other on a base substrate 100, a nano-scale LED element 134 is rotated by an angle β so that both ends thereof move toward different electrodes. In this case, the nano-scale LED element 134 as shown in FIG. 16 may be more affected by an electric field by including metal caps with significantly enhanced surface areas at both end parts thereof. Accordingly, it is possible to facilitate a change in position, such as movement and rotation, of the nano-scale LED element even under a low electric field. Also, when a part of an outer surface of the metal cap, preferably, an outer surface of the metal cap positioned in diagonal directions of the electrode in the cross-section of the electrode, are curved, it is possible to easily perform positional alignment so that two different electrode surfaces are perpendicular to a length direction of the element, and thus a larger number of nano-scale LED elements can be included in a limited area of the horizontal array assembly.

An electric field needed for self-alignment of the nano-scale LED elements may be formed by applying the power to the first electrode and the second electrode. The power may be direct current or alternating current, and may be changed in consideration of an aspect ratio of the nano-scale element, and thus the present invention has no special limitation thereon.

The technical spirit of the present invention has been specifically described with reference to the preferred embodiments, but it should be noted that the embodiments are provided only for illustration and not for limitation. Also, it should be understood by those skilled in the art that various modifications can be made without departing from the scope of the preset invention.

The invention claimed is:

1. A light-emitting diode (LED) element comprising:
a first semiconductor layer and a second semiconductor layer;
an active layer disposed between the first semiconductor layer and the second semiconductor layer;
an insulating film covering at least an outer surface of the active layer; and
an electrode disposed directly on at least one of the first semiconductor layer or the second semiconductor layer, wherein the electrode contacts at least portion of upper surface and side surface of the insulating film.

2. The LED element of claim 1, wherein any one of the first semiconductor layer and the second semiconductor layer includes at least one n-type semiconductor layer, and the other one includes at least one p-type semiconductor layer.

3. The LED element of claim 1, wherein the LED element has a swab-shaped or dumbbell-shaped cross-section in a direction perpendicular to a width of the element.

4. The LED element of claim 1, wherein a ratio of a surface area of the electrode to a sectional area of at least one end of the LED element ranges from 1:1.1 to 1:10.0.

5. The LED element of claim 1, wherein the LED element has a length of 100 nm to 10 μm, and the LED element has a diameter of 100 nm to 5 μm.

6. The LED element of claim 1, wherein the insulating film covers at least an outer surface of the first semiconductor layer or an outer surface of the second semiconductor layer.

7. The LED element of claim 6, wherein the electrode partially covers the outer surface of the insulating film.

8. The LED element of claim 1, wherein a length of the insulating film is shorter than a length of the LED element, and
wherein the electrode covers at least a portion of a side surface of the first semiconductor layer or the second semiconductor layer and is spaced apart from the insulating film.

9. The LED element of claim 1, wherein the electrode is formed so as to protrude from an end of the LED element.

10. The LED element of claim 1, wherein an outer surface of the electrode that faces a contact surface with the first or second semiconductor layer is at least partially curved.

* * * * *